(12) United States Patent
Yu et al.

(10) Patent No.: US 12,165,941 B2
(45) Date of Patent: Dec. 10, 2024

(54) SEMICONDUCTOR DEVICE AND METHOD OF MANUFACTURE

(71) Applicant: Taiwan Semiconductor Manufacturing Co., Ltd., Hsinchu (TW)

(72) Inventors: Chen-Hua Yu, Hsinchu (TW); Chien-Hsun Lee, Chu-tung Town (TW); Jiun Yi Wu, Zhongli (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 17/870,222

(22) Filed: Jul. 21, 2022

(65) Prior Publication Data

US 2022/0359327 A1 Nov. 10, 2022

Related U.S. Application Data

(62) Division of application No. 16/121,866, filed on Sep. 5, 2018, now Pat. No. 11,488,881.

(60) Provisional application No. 62/648,297, filed on Mar. 26, 2018.

(51) Int. Cl.
| | |
|---|---|
| H01L 23/31 | (2006.01) |
| H01L 21/48 | (2006.01) |
| H01L 21/56 | (2006.01) |
| H01L 23/00 | (2006.01) |
| H01L 23/498 | (2006.01) |

(52) U.S. Cl.
CPC ...... *H01L 23/3114* (2013.01); *H01L 21/4853* (2013.01); *H01L 21/486* (2013.01); *H01L 21/561* (2013.01); *H01L 23/49816* (2013.01); *H01L 23/49827* (2013.01); *H01L 24/14* (2013.01); *H01L 24/19* (2013.01); *H01L 24/46* (2013.01); *H01L 24/96* (2013.01)

(58) Field of Classification Search
None
See application file for complete search history.

(56) References Cited

U.S. PATENT DOCUMENTS

| | | |
|---|---|---|
| 6,972,964 B2 | 12/2005 | Ho et al. |
| 7,902,660 B1 * | 3/2011 | Lee .......................... H01L 24/32 |
| | | 257/E21.507 |
| 8,361,842 B2 | 1/2013 | Yu et al. |
| 8,680,647 B2 | 3/2014 | Yu et al. |
| 8,703,542 B2 | 4/2014 | Lin et al. |
| 8,759,964 B2 | 6/2014 | Pu et al. |
| 8,778,738 B1 | 7/2014 | Lin et al. |
| 8,785,299 B2 | 7/2014 | Mao et al. |
| 8,803,306 B1 | 8/2014 | Yu et al. |

(Continued)

FOREIGN PATENT DOCUMENTS

| | | |
|---|---|---|
| CN | 103731979 A | 4/2014 |
| CN | 103811459 A | 5/2014 |

(Continued)

*Primary Examiner* — Long Pham
(74) *Attorney, Agent, or Firm* — Slater Matsil, LLP

(57) ABSTRACT

An integrated fan out package is utilized in which the dielectric materials of different redistribution layers are utilized to integrate the integrated fan out package process flows with other package applications. In some embodiments an Ajinomoto or prepreg material is utilized as the dielectric in at least some of the overlying redistribution layers.

20 Claims, 29 Drawing Sheets

(56) References Cited

U.S. PATENT DOCUMENTS

| | | |
|---|---|---|
| 8,809,996 B2 | 8/2014 | Chen et al. |
| 8,829,676 B2 | 9/2014 | Yu et al. |
| 8,877,554 B2 | 11/2014 | Tsai et al. |
| 8,878,360 B2 * | 11/2014 | Meyer ................... H01L 24/92 |
| | | 257/734 |
| 9,935,080 B2 | 4/2018 | Hung et al. |
| 2006/0163730 A1 | 7/2006 | Matsumoto et al. |
| 2009/0230527 A1 | 9/2009 | Shen |
| 2011/0291288 A1 | 12/2011 | Wu et al. |
| 2012/0153445 A1 | 6/2012 | Son et al. |
| 2013/0026468 A1 | 1/2013 | Yoshimuta et al. |
| 2013/0062760 A1 * | 3/2013 | Hung ................... H01L 23/5389 |
| | | 257/738 |
| 2013/0062761 A1 | 3/2013 | Lin et al. |
| 2013/0168848 A1 | 7/2013 | Lin et al. |
| 2013/0307140 A1 | 11/2013 | Huang et al. |
| 2014/0104798 A1 | 4/2014 | Park et al. |
| 2014/0124944 A1 | 5/2014 | Zhang et al. |
| 2014/0203429 A1 | 7/2014 | Yu et al. |
| 2014/0225222 A1 | 8/2014 | Yu et al. |
| 2014/0252646 A1 | 9/2014 | Hung et al. |
| 2014/0264930 A1 | 9/2014 | Yu et al. |
| 2015/0008586 A1 | 1/2015 | Tsai et al. |
| 2017/0110413 A1 * | 4/2017 | Chen ................... H01L 23/3107 |
| 2017/0338204 A1 | 11/2017 | Lee et al. |
| 2017/0373031 A1 | 12/2017 | Yajima et al. |
| 2019/0103353 A1 | 4/2019 | Liu et al. |
| 2019/0115299 A1 | 4/2019 | Hsieh et al. |
| 2019/0148254 A1 * | 5/2019 | Na ........................... H01L 24/26 |
| | | 257/774 |
| 2020/0135601 A1 * | 4/2020 | Hsieh ..................... H01L 24/32 |
| 2022/0359327 A1 * | 11/2022 | Yu ........................... H01L 24/96 |

FOREIGN PATENT DOCUMENTS

| | | |
|---|---|---|
| CN | 206022346 U | 3/2017 |
| CN | 107479034 A | 12/2017 |
| CN | 107546213 A | 1/2018 |
| DE | 102013107244 A1 | 6/2014 |
| KR | 20120067025 A | 6/2012 |
| TW | 201806047 A | 2/2018 |
| WO | 2004090974 A1 | 10/2004 |

* cited by examiner

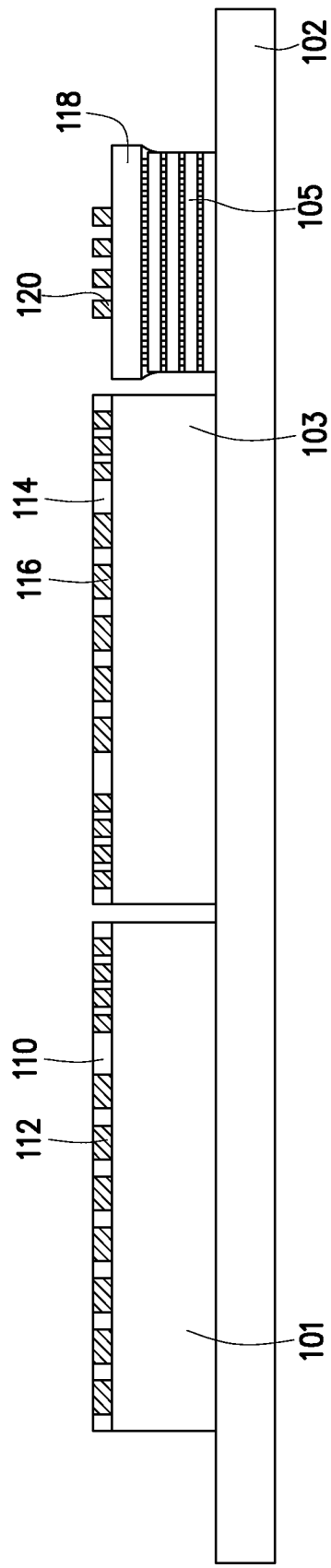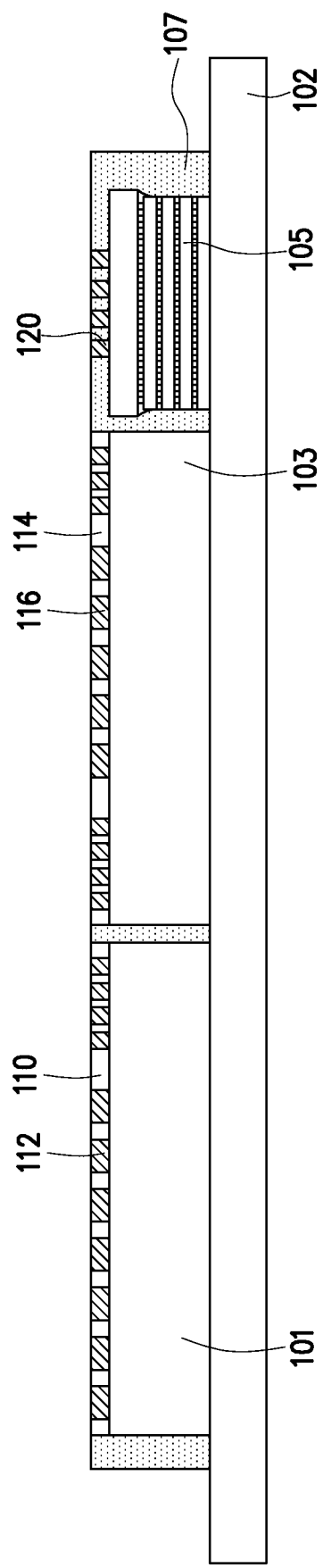
FIG. 1A
FIG. 1B

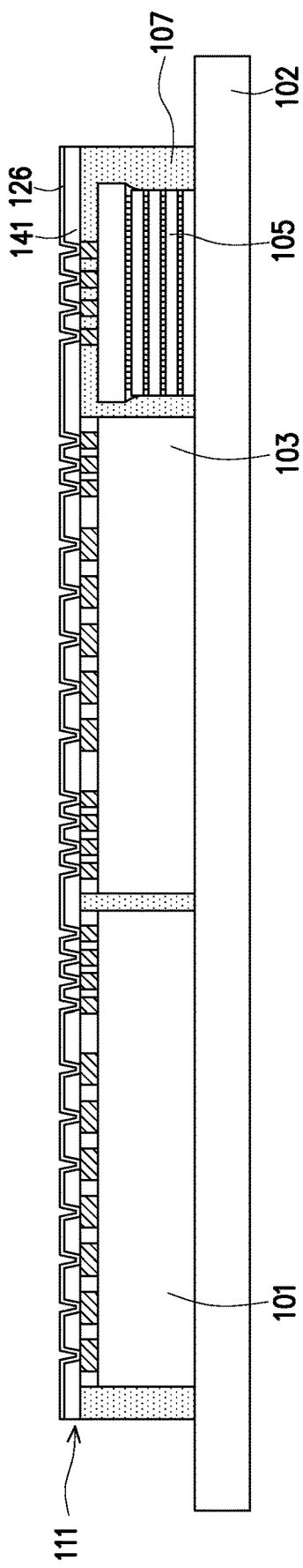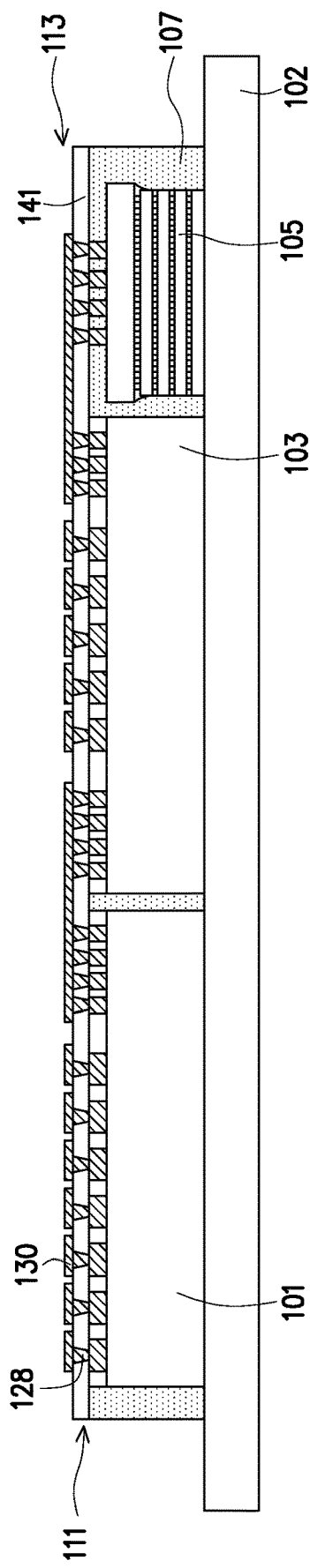

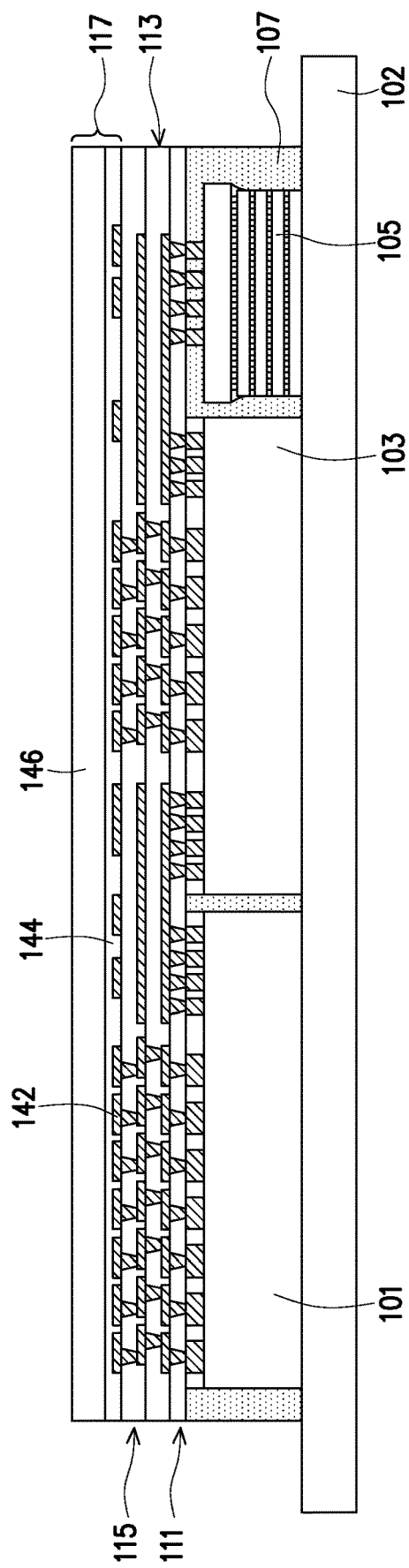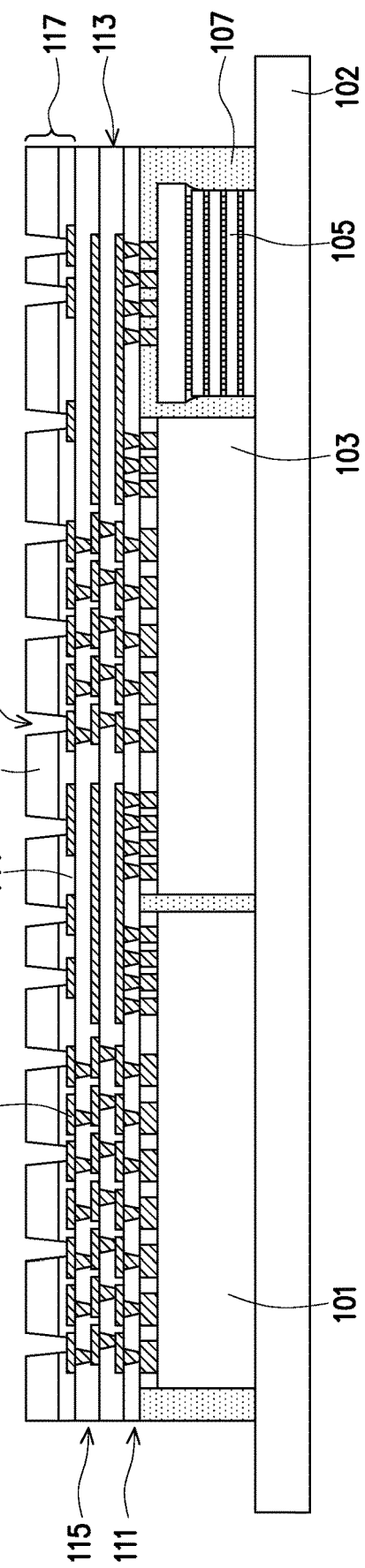

SEMICONDUCTOR DEVICE AND METHOD OF MANUFACTURE

PRIORITY CLAIM AND CROSS-REFERENCE

This application is a division of U.S. patent application Ser. No. 16/121,866, filed on Sep. 5, 2018, entitled "Semiconductor Device and Method of Manufacture," which claims priority to and the benefit of U.S. Provisional Application No. 62/648,297, filed on Mar. 26, 2018, entitled "Semiconductor Device and Method of Manufacture," which applications are hereby incorporated herein by reference in their entirety.

BACKGROUND

The semiconductor industry has experienced rapid growth due to continuous improvements in the integration density of a variety of electronic components (e.g., transistors, diodes, resistors, capacitors, etc.). For the most part, this improvement in integration density has come from repeated reductions in minimum feature size (e.g., shrinking the semiconductor process node towards the sub-20 nm node), which allows more components to be integrated into a given area. As the demand for miniaturization, higher speed and greater bandwidth, as well as lower power consumption and latency has grown recently, there has grown a need for smaller and more creative packaging techniques of semiconductor dies.

As semiconductor technologies further advance, stacked and bonded semiconductor devices have emerged as an effective alternative to further reduce the physical size of a semiconductor device. In a stacked semiconductor device, active circuits such as logic, memory, processor circuits and the like are fabricated at least partially on separate substrates and then physically and electrically bonded together in order to form a functional device. Such bonding processes utilize sophisticated techniques, and improvements are desired.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1C:
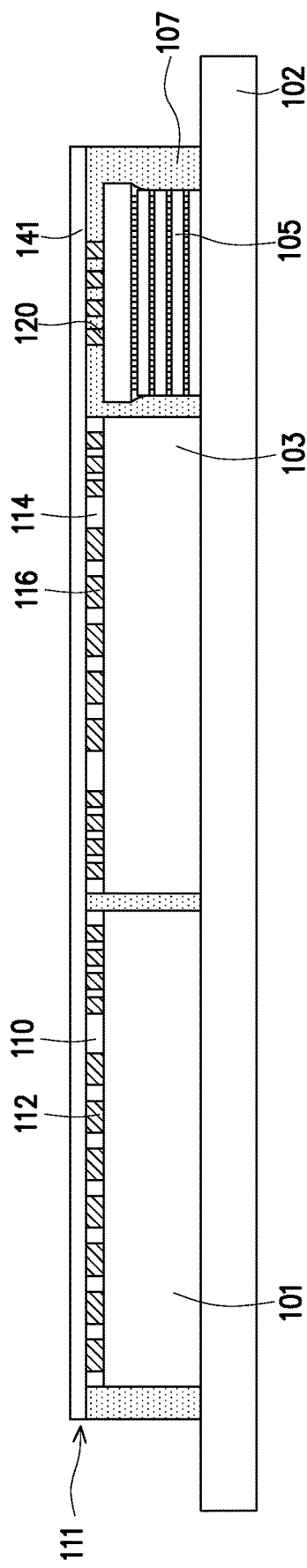
FIGS. 1A-1T illustrate a semiconductor device with a composite redistribution layer in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments will now be described with respect to a specific embodiment in which an integrated fan out (InFO) process is integrated along with an Ajinomoto build up film (ABF) or prepreg lamination process for super large package applications (e.g., larger than 100 mmSQ (100 mm*100 mm). However, the embodiments may be utilized in a wide variety of ways, and are not intended to be limited to the embodiments described herein.

With reference now to FIG. 1A, there is illustrated a first semiconductor device 101, a second semiconductor device 103, and a memory stack 105 that have been placed on a carrier wafer 102. In some embodiments, the first semiconductor device 101 and the second semiconductor device 103 are also referred to as a first semiconductor die 101 and a second semiconductor die 103. In an embodiment the first semiconductor device 101 is designed for a desired functionality, such as being a system-on-chip, a graphic die, a MEMS dies, a sensor die, a photonic die, a memory die, other logic dies, combinations of these, or the like. In some embodiments the first semiconductor device 101 comprises a first substrate, first active devices, first metallization layers, first contact pads (not individually illustrated), a first passivation layer 110, and first external connectors 112. The first substrate may comprise bulk silicon, doped or undoped, or an active layer of a silicon-on-insulator (SOI) substrate. Generally, an SOI substrate comprises a layer of a semiconductor material such as silicon, germanium, silicon germanium, silicon germanium on insulator (SGOI), or combinations thereof. Other substrates that may be used include multi-layered substrates, gradient substrates, or hybrid orientation substrates.

The first active devices comprise a wide variety of active devices and passive devices such as capacitors, resistors, inductors and the like that may be used to generate the desired structural and functional objectives of the design for the first semiconductor device 101. The first active devices may be formed using any suitable methods either within or else on the first substrate.

The first metallization layers are formed over the first substrate and the first active devices and are designed to connect the various active devices to form functional circuitry. In an embodiment the first metallization layers are formed of alternating layers of dielectric and conductive material and may be formed through any suitable process (such as deposition, damascene, dual damascene, etc.). In an embodiment there may be four layers of metallization separated from the first substrate by at least one interlayer dielectric layer (ILD), but the precise number of first metallization layers is dependent upon the design of the first semiconductor device 101.

The first contact pads may be formed over and in electrical contact with the first metallization layers. The first contact pads may comprise aluminum, but other materials, such as copper, may alternatively be used. The first contact pads may be formed using a deposition process, such as sputtering, to form a layer of material (not shown) and portions of the layer of material may then be removed through a suitable process (such as photolithographic masking and etching) to form the first contact pads. However, any other suitable process may be utilized to form the first contact pads. The first contact pads may be formed to have a thickness of between about 0.5 μm and about 4 μm, such as about 1.45 μm.

The first passivation layer 110 may be formed on the first substrate over the first metallization layers and the first contact pads. The first passivation layer 110 may be made of one or more suitable dielectric materials such as silicon oxide, silicon nitride, low-k dielectrics such as carbon doped oxides, extremely low-k dielectrics such as porous carbon doped silicon dioxide, combinations of these, or the like. The first passivation layer 110 may be formed through a process such as chemical vapor deposition (CVD), although any suitable process may be utilized, and may have a thickness between about 0.5 μm and about 5 μm, such as about 9.25 KA.

The first external connectors 112 may be formed to provide conductive regions for contact between the first contact pads and, e.g., a first redistribution layer 111 (not illustrated in FIG. 1A but illustrated and described further below with respect to FIGS. 1C-1F). In an embodiment the first external connectors 112 may be conductive pillars and may be formed by initially forming a photoresist (not shown) over the first passivation layer 110 to a thickness between about 5 μm to about 20 μm, such as about 10 μm. The photoresist may be patterned to expose portions of the first passivation layer 110 through which the conductive pillars will extend. Once patterned, the photoresist may then be used as a mask to remove the desired portions of the first passivation layer 110, thereby exposing those portions of the underlying first contact pads to which the first external connectors 112 will make contact.

The first external connectors 112 may be formed within the openings of both the first passivation layer 110 and the photoresist. The first external connectors 112 may be formed from a conductive material such as copper, although other conductive materials such as nickel, gold, or metal alloy, combinations of these, or the like may also be used. Additionally, the first external connectors 112 may be formed using a process such as electroplating, by which an electric current is run through the conductive portions of the first contact pads to which the first external connectors 112 are desired to be formed, and the first contact pads are immersed in a solution. The solution and the electric current deposit, e.g., copper, within the openings in order to fill and/or overfill the openings of the photoresist and the first passivation layer 110, thereby forming the first external connectors 112. Excess conductive material and photoresist outside of the openings of the first passivation layer 110 may then be removed using, for example, an ashing process, a chemical mechanical polish (CMP) process, combinations of these, or the like.

However, as one of ordinary skill in the art will recognize, the above described process to form the first external connectors 112 is merely one such description, and is not meant to limit the embodiments to this exact process. Rather, the described process is intended to be merely illustrative, as any suitable process for forming the first external connectors 112 may alternatively be utilized. All suitable processes are fully intended to be included within the scope of the present embodiments.

The second semiconductor device 103 may be similar to the first semiconductor device 101 and may be, for example, a system-on-chip, a graphic die, a MEMS die, a sensor die, a photonic die, a memory die, other logic dies, and may comprise a second substrate, second active devices, second metallization layers, second contact pads (not individually illustrated), a second passivation layer 114, and second external connectors 116. In an embodiment the second substrate, the second active devices, the second metallization layers, the second contact pads, the second passivation layer 114, and the second external connectors 116 may be similar to the first substrate, the first active devices, the first metallization layers, the first contact pads, the first passivation layer 110, and the first external connectors 112, although they may also be different.

The memory stack 105 may be a stack of one or more semiconductor dies which are designed to be utilized in conjunction with each other, with the first semiconductor device 101, and with the second semiconductor device 103. In a particular embodiment the memory stack 105 may be a stack of memory dies that are physically and electrically bonded to a first active devices interposer substrate 118. The interposer substrate 118 may comprise connections such as through substrate vias (TSVs) in order to connect the individual memory dies within the stack of memory dies to third external connectors 120. The third external connectors 120 may be similar to the first external connectors 112, although they may also be different.

Each of the first semiconductor device 101, the second semiconductor device 103, and the memory stack 105 are placed onto the carrier wafer 102. In an embodiment the carrier wafer 102 may be a glass carrier and the first semiconductor device 101, the second semiconductor device 103, and the memory stack 105 may be placed onto the carrier wafer 102 using, e.g., a pick and place device.

FIG. 1B illustrates that, once the first semiconductor device 101, the second semiconductor device 103, and the memory stack 105 are placed on the carrier wafer 102, the first semiconductor device 101, the second semiconductor device 103, and the memory stack 105 are encapsulated within an encapsulant 107. The encapsulation may be performed in a molding device (not individually illustrated in FIG. 1B). For example, the first semiconductor device 101, the second semiconductor device 103, and the memory stack 105 may be placed within a cavity of the molding device, and the cavity may be hermetically sealed. The encapsulant 107 may be placed within the cavity either before the cavity is hermetically sealed or else may be injected into the cavity through an injection port. In an embodiment the encapsulant 107 may be a molding compound resin such as polyimide, PPS, PEEK, PES, a heat resistant crystal resin, combinations of these, or the like.

Once the encapsulant 107 has been placed into the molding cavity such that the encapsulant 107 encapsulates the first semiconductor device 101, the second semiconductor device 103, and the memory stack 105, the encapsulant 107 may be cured in order to harden the encapsulant 107 for optimum protection. While the exact curing process is dependent at least in part on the particular material chosen for the encapsulant 107, in an embodiment in which molding compound is chosen as the encapsulant 107, the curing could occur through a process such as heating the encapsulant 107 to between about 100° C. and about 130° C., such as about 125° C. for about 60 sec to about 3000 sec, such as about 600 sec. Additionally, initiators and/or catalysts may be included within the encapsulant 107 to better control the curing process.

However, as one having ordinary skill in the art will recognize, the curing process described above is merely an exemplary process and is not meant to limit the current embodiments. Other curing processes, such as irradiation or even allowing the encapsulant 107 to harden at ambient temperature, may alternatively be used. Any suitable curing process may be used, and all such processes are fully intended to be included within the scope of the embodiments discussed herein.

Once the encapsulant 107 has been placed, the encapsulant 107 is thinned in order to expose the first external connectors 112, the second external connectors 116 and the third external connectors 120 for further processing. The thinning may be performed, e.g., using a mechanical grinding or chemical mechanical polishing (CMP) process whereby chemical etchants and abrasives are utilized to react and grind away the encapsulant 107 until the first external connectors 112, the second external connectors 116 and the third external connectors 120 have been exposed. As such, the first external connectors 112, the second external connectors 116 and the third external connectors 120 may have a planar surface that is also planar with the encapsulant 107.

However, while the CMP process described above is presented as one illustrative embodiment, it is not intended to be limiting to the embodiments. Any other suitable removal process may alternatively be used to thin the encapsulant 107 and expose the first external connectors 112, the second external connectors 116 and the third external connectors 120. For example, a series of chemical etches may alternatively be utilized. This process and any other suitable process may alternatively be utilized to thin the encapsulant 107 and expose the first external connectors 112, the second external connectors 116 and the third external connectors 120, and all such processes are fully intended to be included within the scope of the embodiments.

FIG. 1C illustrates the start of formation of a first redistribution layer 111 in contact with the first external connectors 112, the second external connectors 116 and the third external connectors 120 in order to interconnect the first external connectors 112, the second external connectors 116 and the third external connectors 120 with each other and other overlying structures. In an embodiment the first redistribution layer 111 may comprise a first redistribution passivation layer 141, which may be polyimide, although any suitable material, such as a polyimide derivative, such as a low temperature cured polyimide, or polybenzoxazole (PBO) may alternatively be utilized. The first redistribution passivation layer 141 may be placed using, e.g., a spin-coating process to a thickness of between about 1 μm μm and about 30 μm μm, such as about 5 μm μm, although any suitable method and thickness may alternatively be used.

Figure 1D:
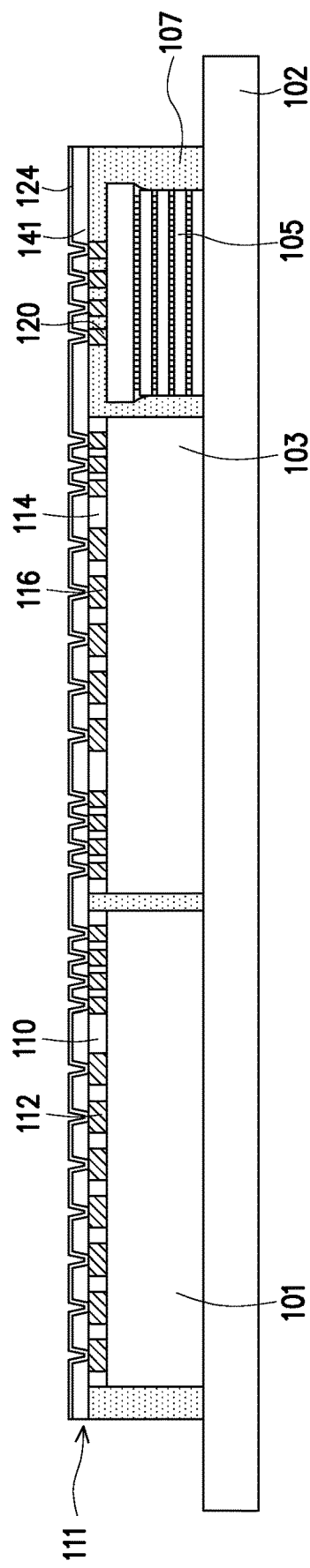

FIG. 1D illustrates that, once the first redistribution passivation layer 141 has been formed, openings be formed through the first redistribution passivation layer 141 in order to expose the underlying first external connectors 112, the second external connectors 116 and the third external connectors 120. In an embodiment the openings may be formed using a photolithographic masking and etching process or, if the material of the first redistribution passivation layer 141 is photosensitive, exposing and developing the material of the first redistribution passivation layer 141. In another embodiment the openings may be formed using a laser process. Any suitable process for forming the openings in the first redistribution passivation layer 141 may be utilized.

Optionally, once the openings are formed, a cleaning process may be performed. In an embodiment an optional plasma ashing cleaning process may be utilized in order to clean and prepare the sidewalls of the openings to receive a glue layer 124. The plasma ashing cleaning process may be performed by generating a plasma from a cleaning precursor such as oxygen or the like and then exposing the surfaces to the plasma within an inert environment such as nitrogen, argon, or the like. However, any suitable cleaning process may alternatively be utilized.

Additionally, once the openings are formed, an optional glue layer 124 may be formed to help adhere subsequently formed materials to the first redistribution passivation layer 141. In an embodiment the glue layer 124 may be titanium, titanium nitride, combinations of these, or the like, formed to a thickness of between about 5% (1/20) and about 20% (1/5), such as about 10%, of the thickness of the first redistribution layer 111 in which the glue layer 124 is located. However, any suitable adhering material may be utilized and any suitable thickness may be utilized.

FIG. 1E (with the glue layer 124 not separately illustrated for the purpose of clarity) illustrates that, once the glue layer 124 has been formed, a first seed layer 126 may be deposited into the openings in order to prepare the openings to be filled with a conductive material such as copper in order to fill and/or overfill the openings. In an embodiment the first seed layer 126 is a thin layer of a conductive material that aids in the formation of a thicker layer during subsequent processing steps. The first seed layer 126 may comprise a layer of titanium about 1,000 Å thick followed by a layer of copper about 5,000 Å thick. The first seed layer 126 may be created using processes such as sputtering, evaporation, or PECVD processes, depending upon the desired materials. The first seed layer 126 may be formed to have a thickness of between about 0.3 μm and about 1 μm, such as about 0.5 μm.

FIG. 1F illustrates a simultaneous formation of a first conductive via 128 of the first redistribution layer 111 as well as a first conductive line portion 130 of a second redistribution layer 113. In an embodiment the first conductive via 128 of the first redistribution layer 111 and the first conductive line portion 130 of a second redistribution layer 113 may be formed by initially placing and patterning a photoresist over the first seed layer 126. In an embodiment the photoresist may be placed on the first seed layer 126 using, e.g., a spin coating technique to a height of between about 50 μm and about 250 μm, such as about 120 μm. Once in place, the photoresist may then be patterned by exposing the photoresist to a patterned energy source (e.g., a patterned light source) so as to induce a chemical reaction, thereby inducing a physical change in those portions of the photoresist exposed to the patterned light source. A developer is then applied to the exposed photoresist to take advantage of the physical changes and selectively remove either the exposed portion of the photoresist or the unexposed portion of the photoresist, depending upon the desired pattern.

In an embodiment the pattern formed into the photoresist is a pattern for the first conductive via 128 of the first redistribution layer 111 as well as the first conductive line portion 130 of the second redistribution layer 113. In an embodiment the first conductive via 128 of the first redistribution layer 111 and the first conductive line portion 130 of a second redistribution layer 113 are formed within the photoresist 109, may comprise one or more conductive materials, such as copper, tungsten, other conductive metals, or the like, and may be formed, for example, by electroplating, electroless plating, or the like. In an embodiment, an electroplating process is used wherein the first seed layer 126 and the photoresist are submerged or immersed in an electroplating solution. The first seed layer 126 surface is electrically connected to the negative side of an external DC power supply such that the first seed layer 126 functions as the cathode in the electroplating process. A solid conductive anode, such as a copper anode, is also immersed in the solution and is attached to the positive side of the power supply. The atoms from the anode are dissolved into the solution, from which the cathode, e.g., the first seed layer 126, acquires the dissolved atoms, thereby plating the exposed conductive areas of the first seed layer 126 within the opening of the photoresist.

Once the first conductive via 128 of the first redistribution layer 111 and the first conductive line portion 130 of the second redistribution layer 113 have been formed using the photoresist and the first seed layer 126, the photoresist may be removed using a suitable removal process. In an embodiment, a plasma ashing process may be used to remove the photoresist, whereby the temperature of the photoresist may be increased until the photoresist experiences a thermal decomposition and may be removed. However, any other suitable process, such as a wet strip, may alternatively be utilized. The removal of the photoresist may expose the underlying portions of the first seed layer 126.

Once exposed a removal of the exposed portions of the first seed layer 126 and the glue layer 124 may be performed. In an embodiment the exposed portions of the first seed layer 126 and the glue layer 124 (e.g., those portions that are not covered by the first conductive via 128 of the first redistribution layer 111 and the first conductive line portion 130 of the second redistribution layer 113) may be removed by, for example, one or more wet or dry etching processes. For example, in a dry etching process reactants may be directed towards the first seed layer 126 and the glue layer 124 using the first conductive via 128 of the first redistribution layer 111 and the first conductive line portion 130 of the second redistribution layer 113 as masks. In another embodiment, etchants may be sprayed or otherwise put into contact with the first seed layer 126 and the glue layer 124 in order to remove the exposed portions of the first seed layer 126 and the underlying glue layer 124.

By plating the first conductive via 128 of the first redistribution layer 111 as well as the first conductive line portion 130 of the second redistribution layer 113 simultaneously, the first redistribution layer 111 is completed while a manufacturing of the second redistribution layer 113 is begun. In an embodiment the first redistribution layer 111 (including the first redistribution passivation layer 141 and the first conductive via 128) may be formed to have a thickness of between about 1 µm and about 30 µm, such as about 5 µm. However, any suitable thickness may be utilized.

Additionally, while the process as described above forms the first conductive via 128 of the first redistribution layer 111 as well as the first conductive line portion 130 of the second redistribution layer 113 simultaneously, this is intended to be illustrative only and is not intended to limit the embodiments. Rather, any suitable process steps may be used to form the first conductive via 128 of the first redistribution layer 111 and the first conductive line portion 130 of the second redistribution layer 113 may be utilized. For example, the first conductive via 128 of the first redistribution layer 111 may be formed using a first set of process which may then be followed by a second set of processes to form the first conductive line portion 130 of the second redistribution layer 113. Any suitable process for forming the first conductive via 128 of the first redistribution layer 111 as well as the first conductive line portion 130 of a second redistribution layer 113 may be utilized.

Figure 1G:
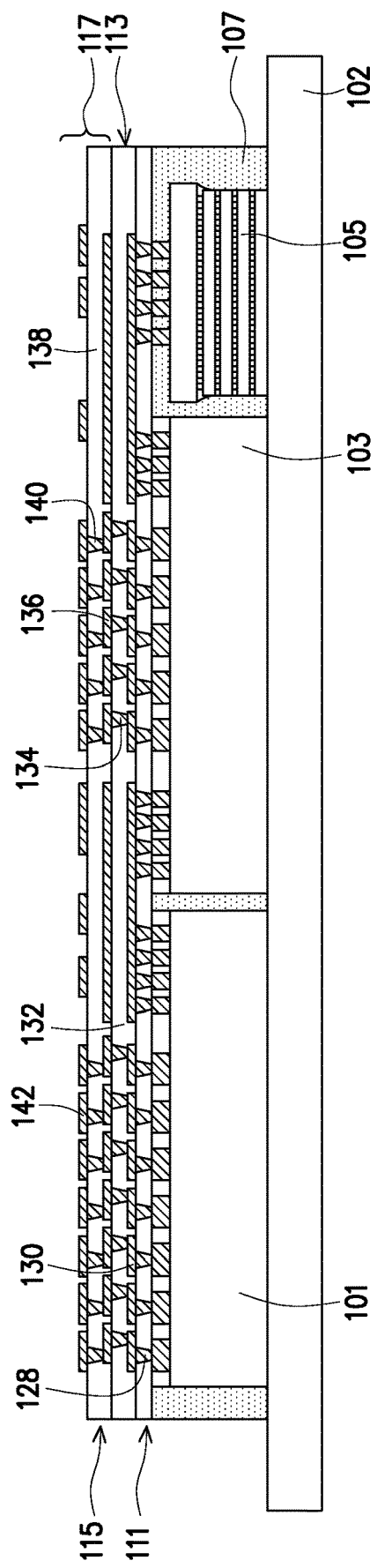

FIG. 1G illustrates that, after the first conductive line portion 130 of the second redistribution layer 113 has been formed, a second redistribution passivation layer 132 may be formed and patterned to help isolate the first conductive line portion 130 of the second redistribution layer 113. In an embodiment the second redistribution passivation layer 132 may be similar to the first redistribution passivation layer 141, such as by being a polyimide material or PBO. The second redistribution passivation layer 132 may be formed or disposed to a thickness of about 7 µm. Once in place, the second redistribution passivation layer 132 may be patterned to form openings using, e.g., a photolithographic masking and etching process or laser process. However, any suitable material and method of patterning may be utilized.

Once the second redistribution passivation layer 132 has been formed, a second conductive via 134 of the second redistribution layer 113 and a second conductive line portion 136 of a third redistribution layer 115 may be formed. In an embodiment the formation of the second conductive via 134 of the second redistribution layer 113 and the second conductive line portion 136 of the third redistribution layer 115 may be performed as described above with respect to the first conductive via 128 of the first redistribution layer 111 and the first conductive line portion 130 of the second redistribution layer 113. For example, an opening may be made through the second redistribution passivation layer 132 using, e.g., a photolithographic masking and etching process. Once the opening has been formed, a separate photoresist is deposited and patterned in the pattern of the second conductive line portion 136 of the third redistribution layer 115, the glue layer 124 may be deposited and the opening may then be filled with a conductive material. In an embodiment the second redistribution layer 113 may be formed to have a thickness of between about 1 µm and about 30 µm, such as about 5 µm. However, any suitable thickness may be utilized.

FIG. 1G additionally illustrates that, after the second conductive line portion 136 of the third redistribution layer 115 has been formed, a third redistribution passivation layer 138 may be formed and patterned to help isolate the second conductive line portion 136 of the third redistribution layer 115. In an embodiment the third redistribution passivation layer 138 may be similar to the first redistribution passivation layer 141, such as by being a polyimide material or PBO. The third redistribution passivation layer 138 may be placed to a thickness of about 7 µm. Once in place, the third redistribution passivation layer 138 may be patterned to form openings using, e.g., a photolithographic masking and etching process or a laser process. However, any suitable material and method of patterning may be utilized.

Once the third redistribution passivation layer 138 has been formed, a third conductive via 140 of the third redistribution layer 115 and a third conductive line portion 142 of a composite redistribution layer 117 may be formed. In an embodiment the formation of the third conductive via 140 of the third redistribution layer 115 and the third conductive line portion 142 of the composite redistribution layer 117 may be performed as described above with respect to the first conductive via 128 of the first redistribution layer 111 and the first conductive line portion 130 of the second redistribution layer 113. For example, an opening may be made through the third redistribution passivation layer 138 using, e.g., a photolithographic masking and etching process. Once the opening has been formed, a separate photoresist is deposited and patterned in the pattern of the third conductive line portion 142 of the composite redistribution layer 117, the glue layer 124 may be deposited and the opening may then be filled with a conductive material before the photoresist is removed. However, any suitable thickness may be utilized.

Figure 1H:
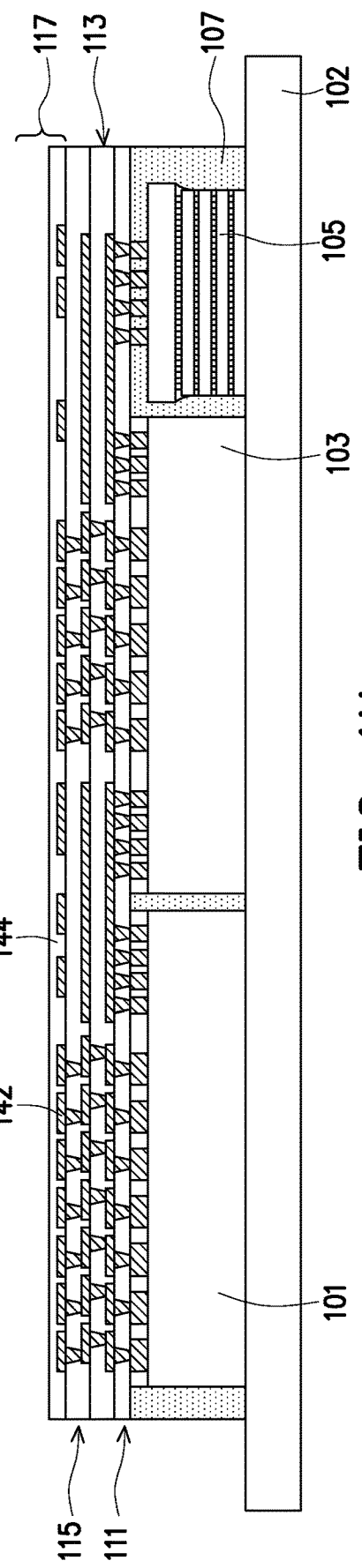

FIG. 1H illustrates that, once the third conductive line portion 142 of the composite redistribution layer 117 is formed, a first composite dielectric material 144 is formed or disposed over the third conductive line portion 142 of the composite redistribution layer 117. The first composite dielectric material 144 may be similar to the first redistribution passivation layer 141, such as by being a polymer such as polyimide deposited using a spin-on process to a first thickness of between about 1 µm and about 30 µm, such as about 5 µm. However, any suitable material and any suitable thickness may be utilized.

FIG. 1I illustrates that, once the first composite dielectric material 144 has been formed, the second composite dielectric material 146 is formed over the first composite dielectric material 144. In an embodiment the second composite dielectric material 146 is different from the first composite dielectric material 144. In an embodiment the second composite dielectric material 146 may be a dielectric material such as an Ajinomoto build up film (ABF), a pre-impregnated (prepreg) material with filler or fiber inside, or a molding compound. In particular embodiments, the second composite dielectric material 146 may be epoxy, phenolic ester, cyanate ester, phnol, filler, glass fibers, combinations of these, or the like. The second composite dielectric material 146 may be laminated onto the first composite dielectric material 144 to a second thickness of between about 1 µm and about 30 µm, such as about 5 µm. However, any suitable material, deposition method, or thickness may be utilized.

FIG. 1J illustrates that, once the second composite dielectric material 146 has been placed, vias 137 (not illustrated in FIG. 1J but illustrated and described below with respect to FIG. 1L) extending through the second composite dielectric material 146 and the first composite dielectric material 144 may be formed. In an embodiment the vias 137 may be formed by first forming via openings 148 through the second composite dielectric material 146 and the first composite dielectric material 144. In a particular embodiment the via openings 148 may be formed using, e.g., a laser drilling process, by which a laser is directed towards those portions of the second composite dielectric material 146 and the first composite dielectric material 144 which are desired to be removed in order to expose the underlying third conductive line portion 142 of the composite redistribution layer 117. During the laser drilling process the drill energy may be in a range from 0.1 mJ to about 60 mJ, and a drill angle of about 0 degree (perpendicular to the third conductive line portion 142 of the composite redistribution layer 117) to about 85 degrees to normal of the third conductive line portion 142 of the composite redistribution layer 117. In an embodiment the patterning may be formed to form the via openings 148 over the third conductive line portion 142 of the composite redistribution layer 117 to have a width of between about 1 µm and about 30 µm, such as about 5 µm. However, any suitable dimensions may be utilized.

Optionally, once the via openings 148 are formed, a cleaning process may be performed. In an embodiment an optional plasma ashing cleaning process may be utilized in order to clean and prepare the sidewalls of the via openings 148. The plasma ashing cleaning process may be performed by generating a plasma from a cleaning precursor such as oxygen or the like and then exposing the surfaces to the plasma within an inert environment such as nitrogen, argon, or the like. However, any suitable cleaning process may alternatively be utilized.

Figure 1K:
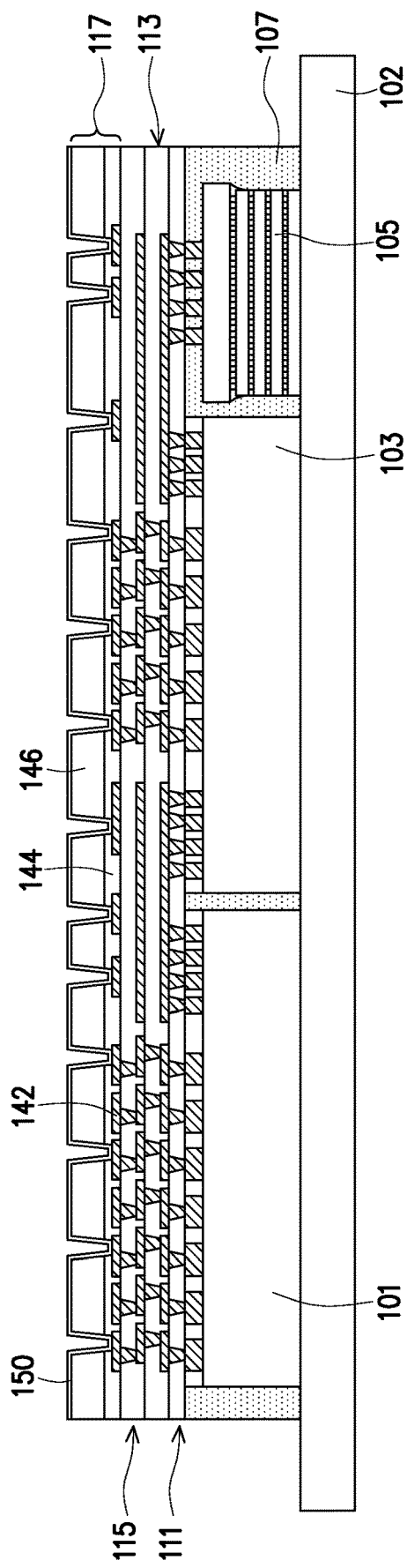

FIG. 1K illustrates that, once the via openings 148 have been formed to extend through both the first composite dielectric material 144 and the second composite dielectric material 146, a second seed layer 150 may be placed to line the via openings 148 in preparation for an eventual filling of the via openings 148. In an embodiment the second seed layer 150 is a thin layer of a conductive material that aids in the formation of a thicker layer during subsequent processing steps. The second seed layer 150 may comprise a layer of titanium about 1,000 Å thick followed by a layer of copper about 5,000 Å thick. The second seed layer 150 may be created using processes such as sputtering, evaporation, or PECVD processes, depending upon the desired materials. The second seed layer 150 may be formed to have a thickness of between about 0.3 µm and about 1 µm, such as about 0.5 µm.

Figure 1L:
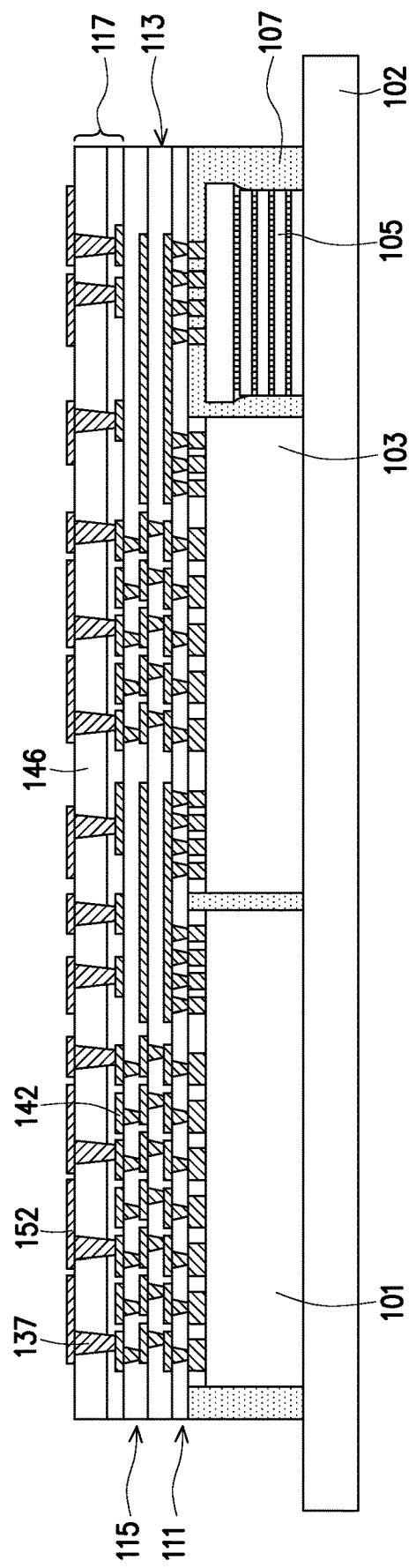

FIG. 1L illustrates a filling of the via openings 148 using the second seed layer 150 (which have been illustrated in FIG. 1L as being part of the conductive material) to form the vias 137 of the composite redistribution layer 117 and a formation of a fourth conductive line portion 152 of a fourth redistribution layer 121. In an embodiment the formation of the vias 137 of the composite redistribution layer 117 and a formation of the fourth conductive line portion 152 of the fourth redistribution layer 121 may be performed as described above with respect to the first conductive via 128 of the first redistribution layer 111 and the first conductive line portion 130 of the second redistribution layer 113. For example, after the via openings 148 have been formed, a photoresist is deposited and patterned in the desired pattern of the fourth conductive line portion 152 of the fourth redistribution layer 121 and the via openings 148 may then be filled with a conductive material before the photoresist is removed and exposed portions of the second seed layer 150 are removed. In an embodiment the composite redistribution layer 117 may be formed to have a thickness of between about 1 µm and about 30 µm, such as about 5 µm. However, any suitable thickness may be utilized.

However, in this embodiment, after the via openings 148 is formed, there is no glue layer 124 formed prior to the formation of the vias 137 of the composite redistribution layer 117 and the formation of the fourth conductive line portion 152 of the fourth redistribution layer 121. In particular, while the third conductive line portion 142 of the composite redistribution layer 117 may have the glue layer 124 located between the third conductive line portion 142 of the composite redistribution layer 117 and the underlying third redistribution passivation layer 138 of the third redistribution layer 115, the glue layer 124 is not present and is absent between the vias 137 of the composite redistribution layer 117 and each of the first composite dielectric material 144, the second composite dielectric material 146, and the third conductive line portion 142 of the composite redistribution layer 117.

Figure 1M:
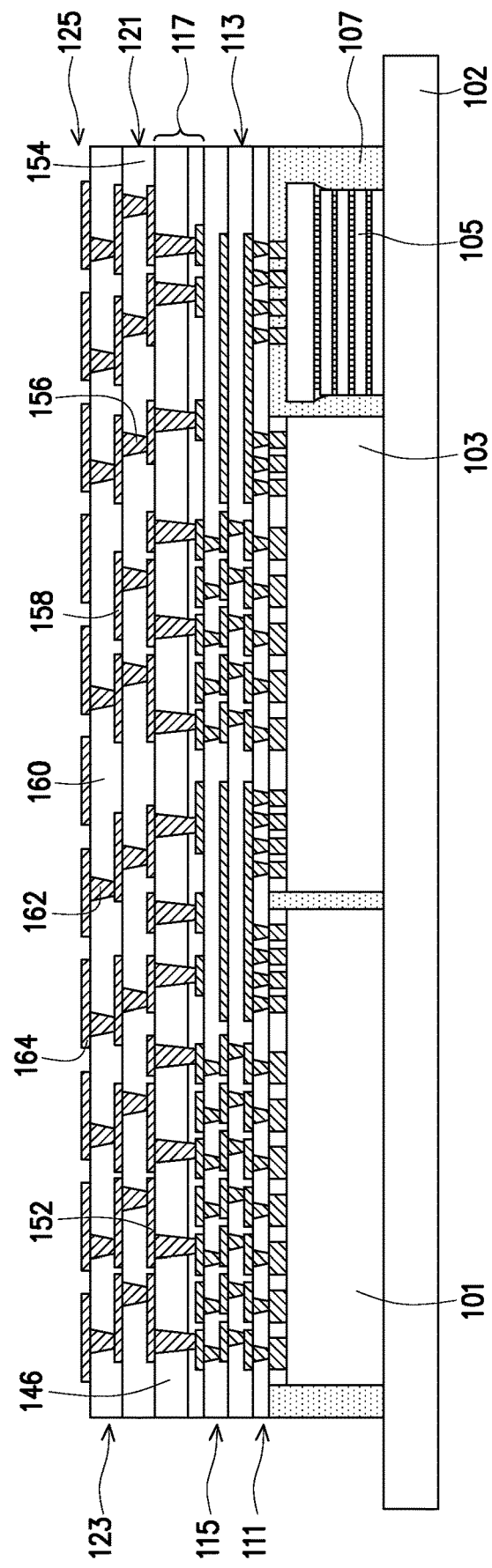

FIG. 1M illustrates a completion of the formation of the fourth redistribution layer 121 over the composite redistribution layer 117. In an embodiment the fourth conductive line portion 152 of the fourth redistribution layer 121 is covered by a fourth redistribution passivation layer 154. In an embodiment the fourth redistribution passivation layer 154 may be similar to the second composite dielectric material 146, such as by being a dielectric material such as an Ajinomoto build up film (ABF), a pre-impregnated (prepreg) material with filler or fiber inside, or a molding compound. The fourth redistribution passivation layer 154 may be placed to a thickness of about 7 µm. Once in place, the fourth redistribution passivation layer 154 may be patterned to form openings using, e.g., a photolithographic masking and etching process. However, any suitable material and method of patterning may be utilized.

Once the fourth redistribution passivation layer 154 has been formed, a fourth conductive via 156 of the fourth redistribution layer 121 and a fourth conductive line portion 158 of the fifth redistribution layer 123 may be formed. In an embodiment the formation of the fourth conductive via 156 of the fourth redistribution layer 121 and the fourth conductive line portion 158 of the fifth redistribution layer 123 may be performed as described above with respect to the first conductive via 128 of the first redistribution layer 111 and the first conductive line portion 130 of the second redistribution layer 113. For example, an opening may be made through the fourth redistribution passivation layer 154 using, e.g., a laser or a photolithographic masking and etching process. Once the opening has been formed, a separate photoresist is deposited and patterned in the pattern of the fourth conductive line portion 158 of the fifth redistribution layer 123, and the opening may then be filled with a conductive material before the photoresist is removed. In an embodiment the fourth redistribution layer 121 may be formed to have a thickness of between about 1 µm and about 30 µm, such as about 5 µm. However, any suitable thickness may be utilized.

FIG. 1M additionally illustrates a completion of the formation of the fifth redistribution layer 123 over the fourth redistribution layer 121. In an embodiment the fourth conductive line portion 158 of the fifth redistribution layer 123 is covered by a fifth redistribution passivation layer 160. In an embodiment the fifth redistribution passivation layer 160 may be similar to the second composite dielectric material 146, such as by being a dielectric material such as an Ajinomoto build up film (ABF) or a prepreg material with filler or fiber inside. The fifth redistribution passivation layer 160 may be placed to a thickness of about 7 µm. Once in place, the fifth redistribution passivation layer 160 may be patterned to form openings using, e.g., a photolithographic masking and etching process. However, any suitable material and method of patterning may be utilized.

Once the fifth redistribution passivation layer 160 has been formed, a fifth conductive via 162 of the fifth redistribution layer 123 and a fifth conductive line portion 164 of a sixth redistribution layer 125 may be formed. In an embodiment the formation of the fifth conductive via 162 of the fifth redistribution layer 123 and a fifth conductive line portion 164 of the sixth redistribution layer 125 may be performed as described above with respect to the first conductive via 128 of the first redistribution layer 111 and the first conductive line portion 130 of the second redistribution layer 113. For example, an opening may be made through the fifth redistribution passivation layer 160 using, e.g., a laser or a photolithographic masking and etching process. Once the opening has been formed, a separate photoresist is deposited and patterned in the pattern of the fifth conductive line portion 164 of the sixth redistribution layer 125, and the opening may then be filled with a conductive material before the photoresist is removed. In an embodiment the fifth redistribution layer 123 may be formed to have a thickness of between about 1 µm and about 30 µm, such as about 5 µm. However, any suitable thickness may be utilized.

Figure 1N:
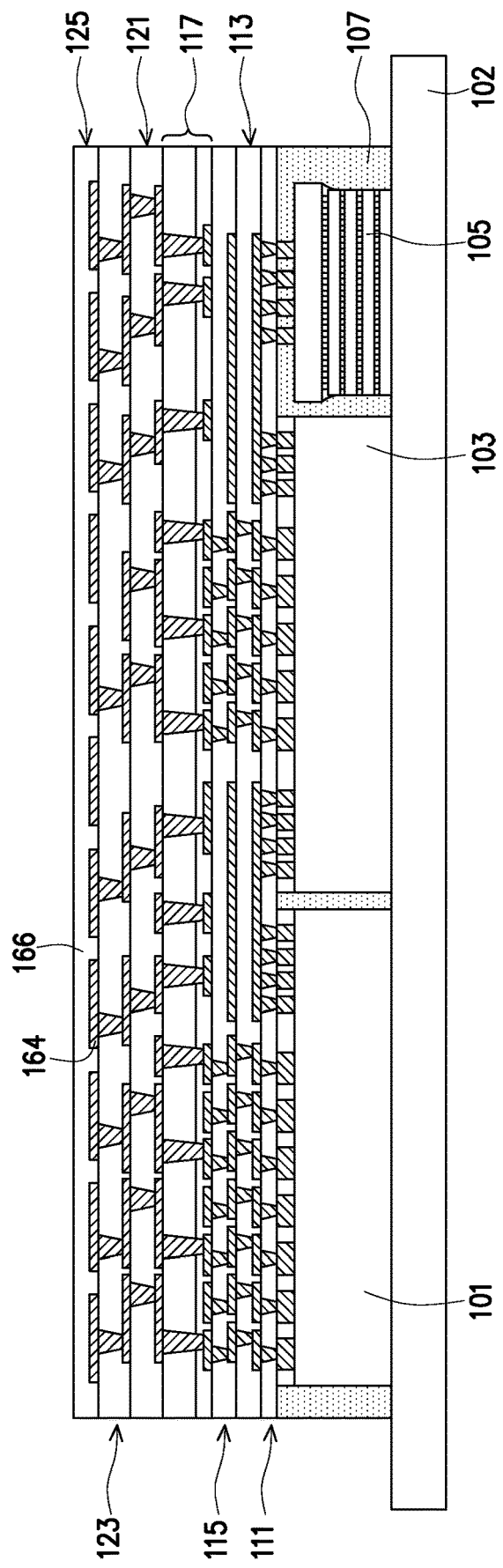
Figure 10:
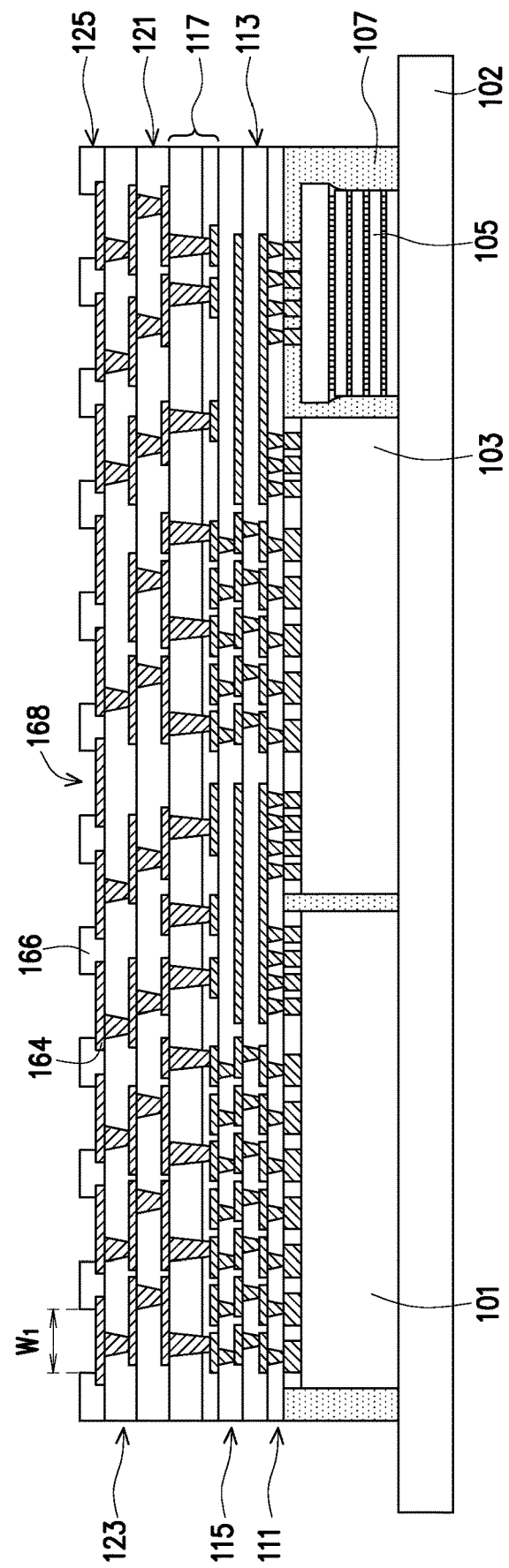

FIG. 1N illustrates a continuation of the formation of the sixth redistribution layer 125 over the fifth redistribution layer 123. In an embodiment the process may be continued by depositing or otherwise placing a sixth redistribution passivation layer 166 over the fifth conductive line portion 164 of the sixth redistribution layer 125. In an embodiment the sixth redistribution passivation layer 166 may be a material such as a solder resist or a PBO polymer, and may be placed to a thickness of between about 1 µm and about 30 µm, such as about 10 µm. However, any suitable material and thickness may be utilized.

FIG. 1O illustrates that once the sixth redistribution passivation layer 166 has been placed, the sixth redistribution passivation layer 166 may be patterned in order to expose at least a portion of the fifth conductive line portion 164 of the sixth redistribution layer 125 and form first openings 168. In an embodiment in which the sixth redistribution passivation layer 166 is photosensitive, the sixth redistribution passivation layer 166 may be patterned by an exposure and development process. In an embodiment in which the sixth redistribution passivation layer 166 is not photosensitive, the sixth redistribution passivation layer 166 may be patterned using a photolithographic masking and etching process. Any suitable process may be utilized.

In an embodiment the first openings 168 are sized in order to accommodate the placement of first external connections 131 (not illustrated in FIG. 1O but illustrated and described further below with respect to FIG. 1Q). As such, while the width of the first openings 168 is dependent at least in part on the type of first external connections 131, in some embodiments the first openings 168 may have a first width $W_1$ of between about 10 µm and about 800 µm, such as about 500 µm. However, any suitable dimensions may be utilized.

Figure 1P:
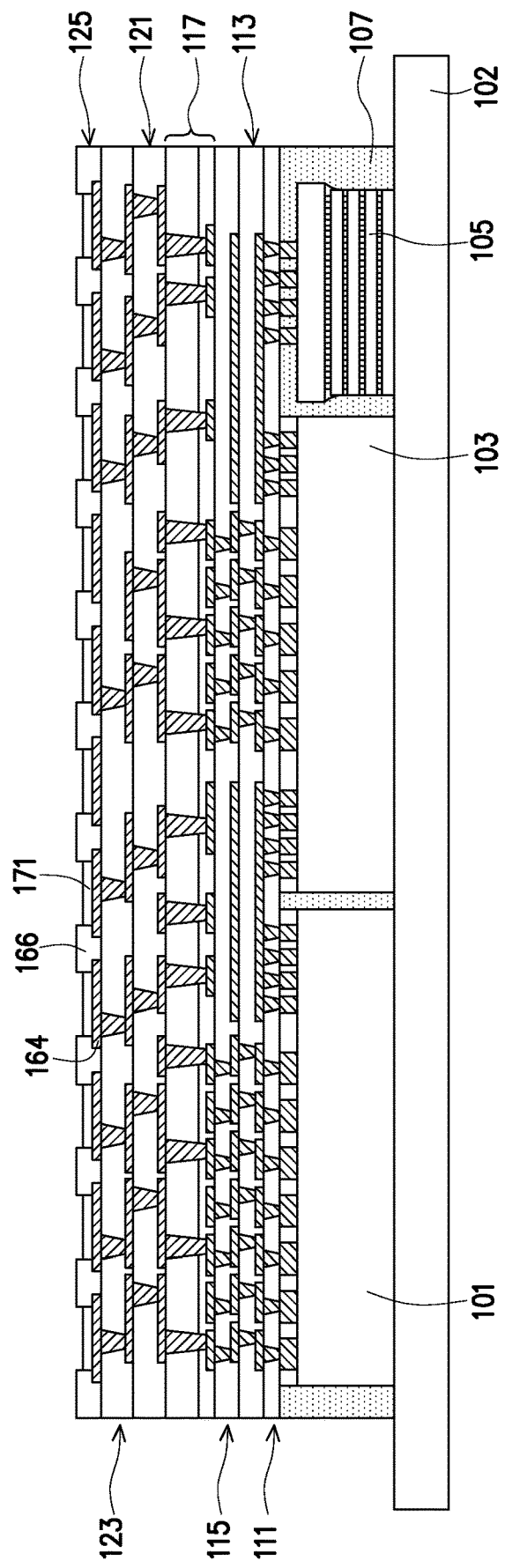

FIG. 1P illustrates an optional metal finish 171 that may be applied to the fifth conductive line portion 164 of the sixth redistribution layer 125. In an embodiment the metal finish 171 may be an Electroless Nickel Electroless Palladium Immersion Gold (ENEPIG), which includes a nickel layer, a palladium layer on the nickel layer, and a gold layer on the palladium layer. The gold layer may be formed using immersion plating. In other embodiments, metal finish 171 may be formed of other finish materials and using other methods, including, but not limited to, Electroless Nickel Immersion Gold (ENIG), Direct Immersion Gold (DIG), or the like. Any suitable materials and methods of manufacture may be utilized.

Figure 1Q:
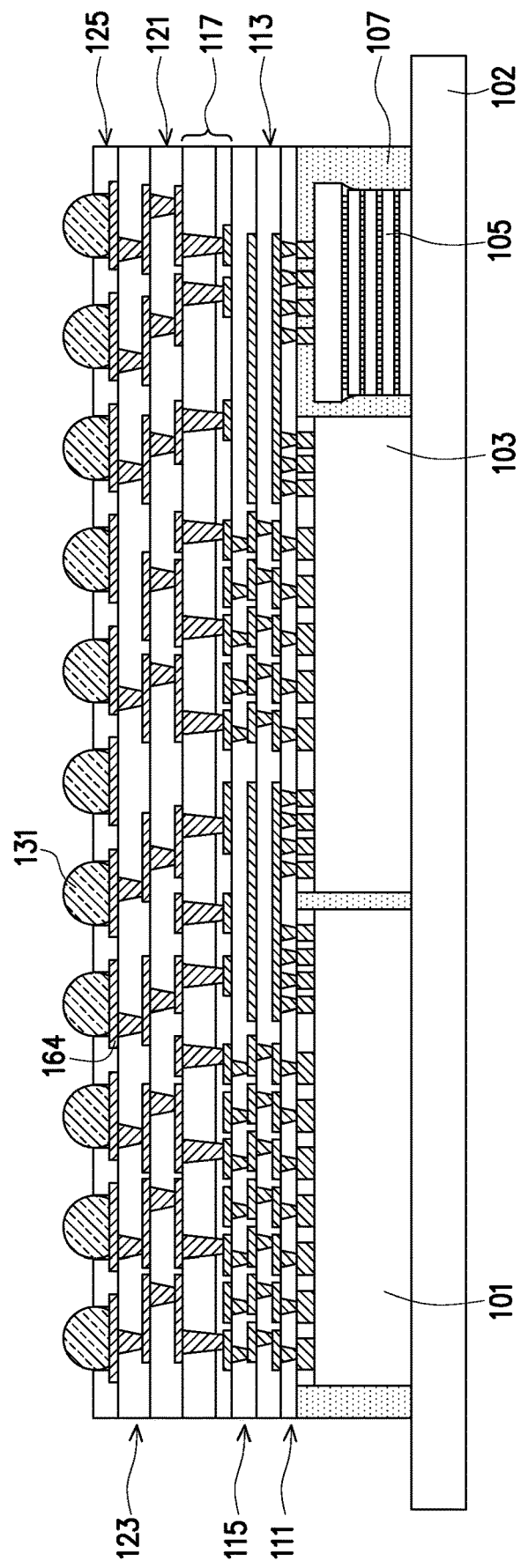

FIG. 1Q illustrates that once the sixth redistribution passivation layer 166 has been patterned, the first external connections 131 may be placed or formed through the sixth redistribution passivation layer 166 and in physical and electrical contact with the fifth conductive line portion 164 of the sixth redistribution layer 125 (or in physical and electrical contact with the metal finish 171 if present). In an embodiment the first external connections 131 may be a ball grid array (BGA) which comprises a eutectic material such as solder, although any suitable materials may alternatively be used. In an embodiment in which the first external connections 131 are solder bumps, the first external connections 131 may be formed using a ball drop method, such as a direct ball drop process. In another embodiment, the solder bumps may be formed by initially forming a layer of tin through any suitable method such as evaporation, electroplating, printing, solder transfer, and then performing a reflow in order to shape the material into the desired bump shape.

Figure 1R:
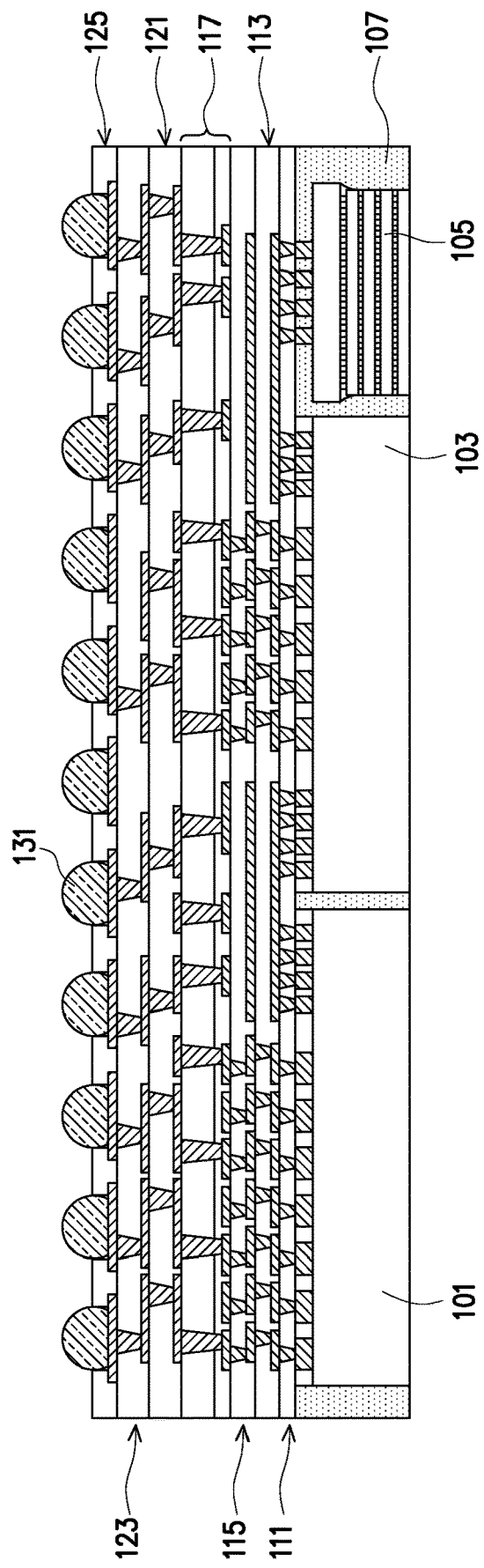

FIG. 1R illustrates a removal of the carrier wafer 102. In an embodiment the carrier wafer 102 may be debonded from the first semiconductor device 101, the second semiconductor device 103 and the memory stack 105 using, e.g., a thermal process to alter the adhesive properties of the adhesive (e.g., DAF) utilized to hold the first semiconductor device 101, the second semiconductor device 103, and the memory stack 105. In a particular embodiment an energy source such as an ultraviolet (UV) laser, a carbon dioxide ($CO_2$) laser, or an infrared (IR) laser, is utilized to irradiate and heat the adhesive material until the adhesive material loses at least some of its adhesive properties. Once performed, the carrier wafer 102 and the adhesive material may be physically separated and removed from the first semiconductor device 101, the second semiconductor device 103 and the memory stack 105.

Figure 1S:
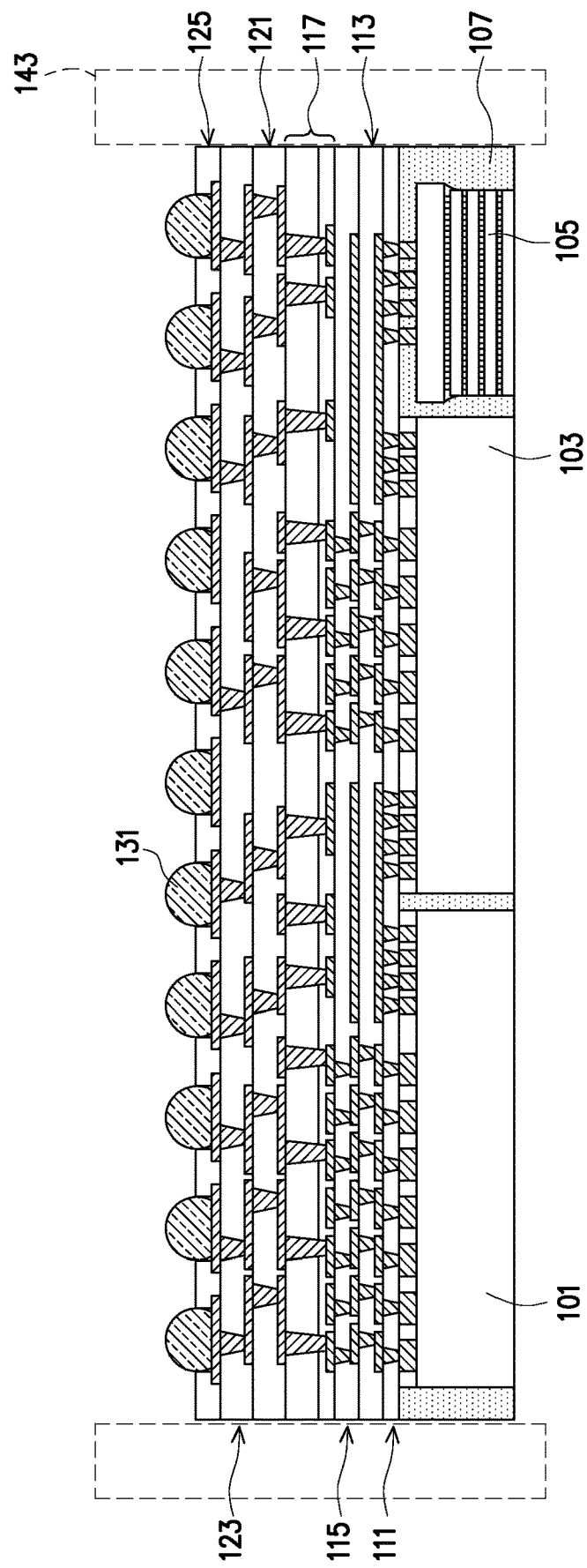

FIG. 1S illustrates a singulation of the structure. In an embodiment the singulation may be performed by using a saw blade (represented in FIG. 1S by the dashed box labeled 143) to slice through the structure, thereby separating one section from another. However, as one of ordinary skill in the art will recognize, utilizing a saw blade in the singulation process is merely one illustrative embodiment and is not intended to be limiting. Alternative methods for singulating the structure, such as utilizing one or more etches to singulate the structure, may also be utilized. These methods and any other suitable methods may alternatively be utilized to singulate the structure.

In particular embodiments the singulation process is utilized to form a first package with a first size. In some embodiments the first size is larger than about 70 mm by 70 mm. In other embodiments the first size is larger than about 100 mm by 100 mm. However, any suitable size for the package may be utilized.

Figure 1T:
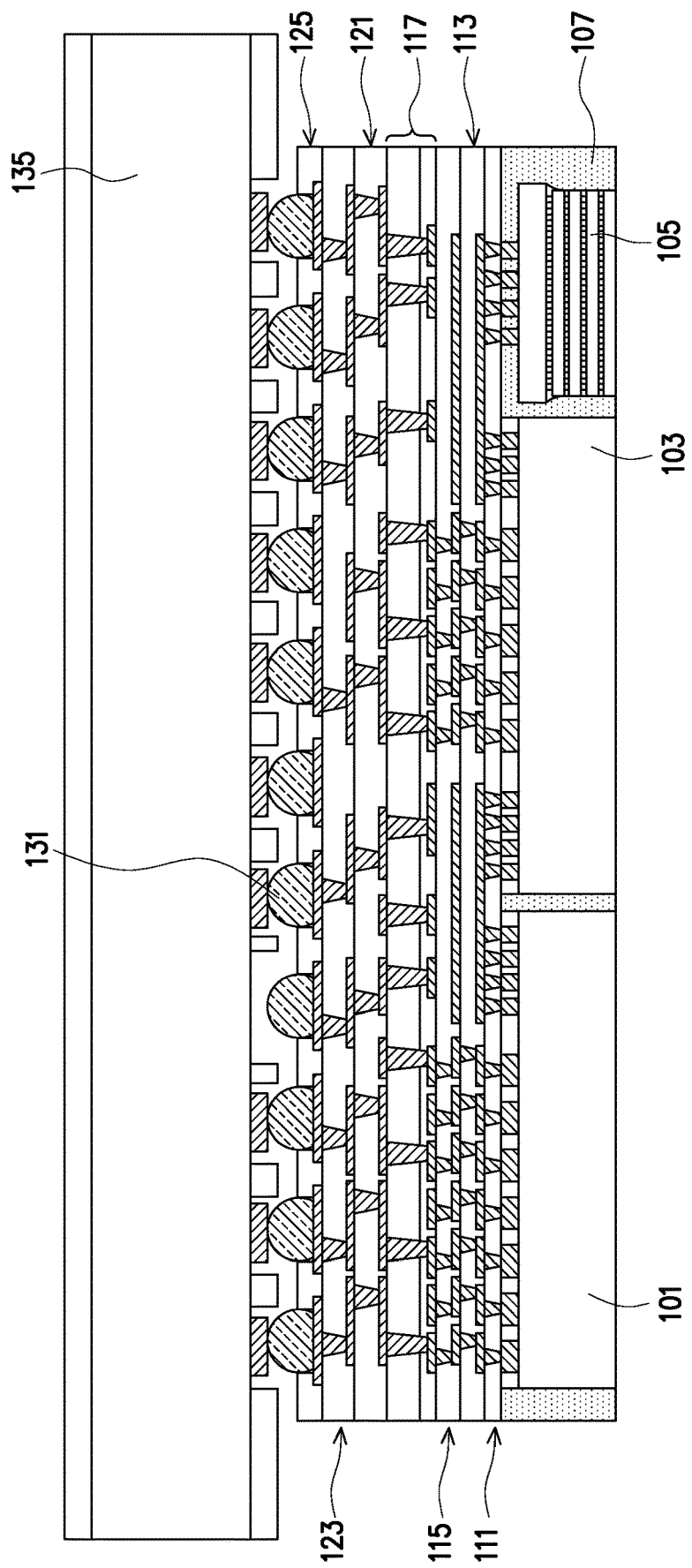

FIG. 1T illustrates a connection of the first external connections 131 to a support substrate 135. In an embodiment the support substrate 135 may be a printed circuit board such as a laminate substrate formed as a stack of multiple thin layers (or laminates) of a polymer material such as bismaleimide triazine (BT), FR-4, ABF, or the like. However, any other suitable substrate, such as a silicon interposer, a silicon substrate, organic substrate, a ceramic substrate, or the like, may alternatively be utilized, and all such redistributive substrates that provide support and connectivity to the structure including the first external connections 131 are fully intended to be included within the scope of the embodiments.

By utilizing the composite redistribution layer as described herein, multiple chips can be packaged with local redistribution layers first and then further distributed utilizing a global redistribution layer. This allows the integrated fan out process to be applied for large package applications such as greater or equal to about 70 mmSQ. As such, high bandwidth (e.g., greater than 1 TbE) electrical performance can be achieved. Additionally, by utilizing the materials as described, the package structure will have an equivalent coefficient of thermal expansion that is close to a printed circuit board, thereby reducing board level reliability stresses while still achieving a simplified process flow.

Figure 2A:
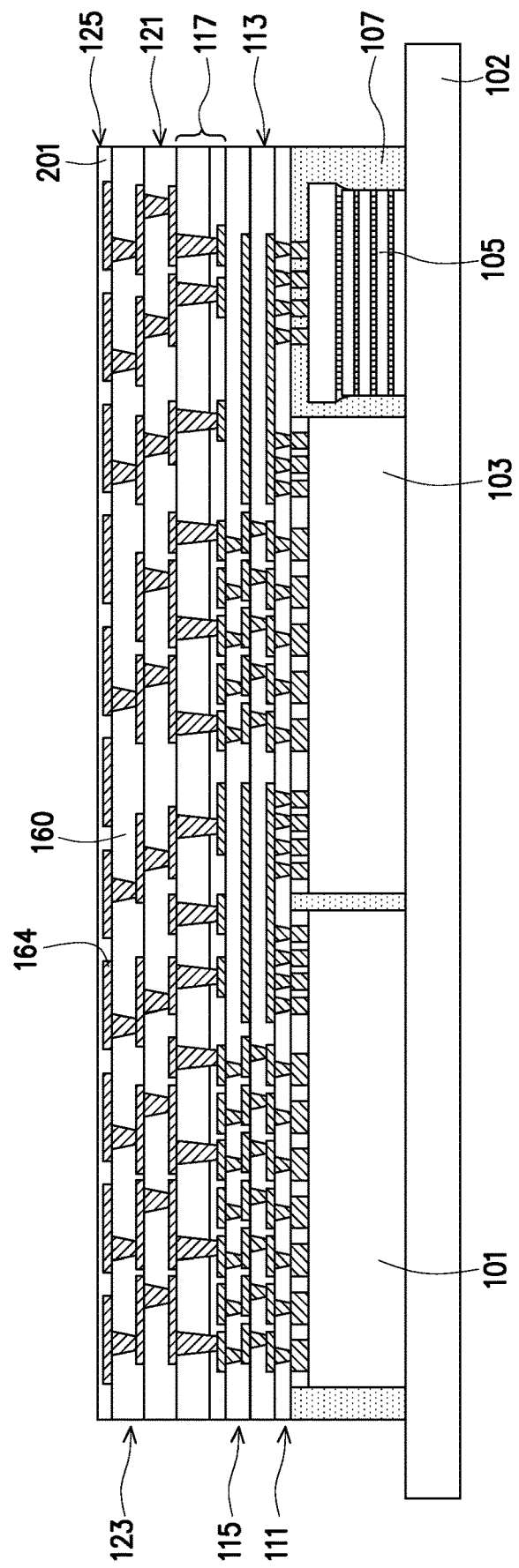
FIGS. 2A-2I illustrate a semiconductor device with a polyimide top dielectric layer in accordance with some embodiments.

FIG. 2A illustrates another embodiment that may be utilized after the process described in FIGS. 1A-1M has been completed. In this embodiment, instead of the sixth redistribution passivation layer 166 of the sixth redistribution layer 125 being formed directly on the fifth conductive line portion 164 of the sixth redistribution layer 125 and the fifth redistribution passivation layer 160 (as illustrated above with respect to FIG. 1N), a polymer layer 201 is formed in direct contact with the fifth conductive line portion 164 and the fifth redistribution passivation layer 160. In an embodiment the polymer layer 201 may be a polymer such as polyimide, although any suitable polymer, such as an acrylate of a novolac type epoxy resin or an imidazole solvent, may be utilized. The polymer layer 201 may be formed using a process such as CVD or spin-on coating to a thickness of between about 5 µm and about 800 µm, such as about 500 µm. However, any suitable process and thickness may be utilized.

Figure 2B:
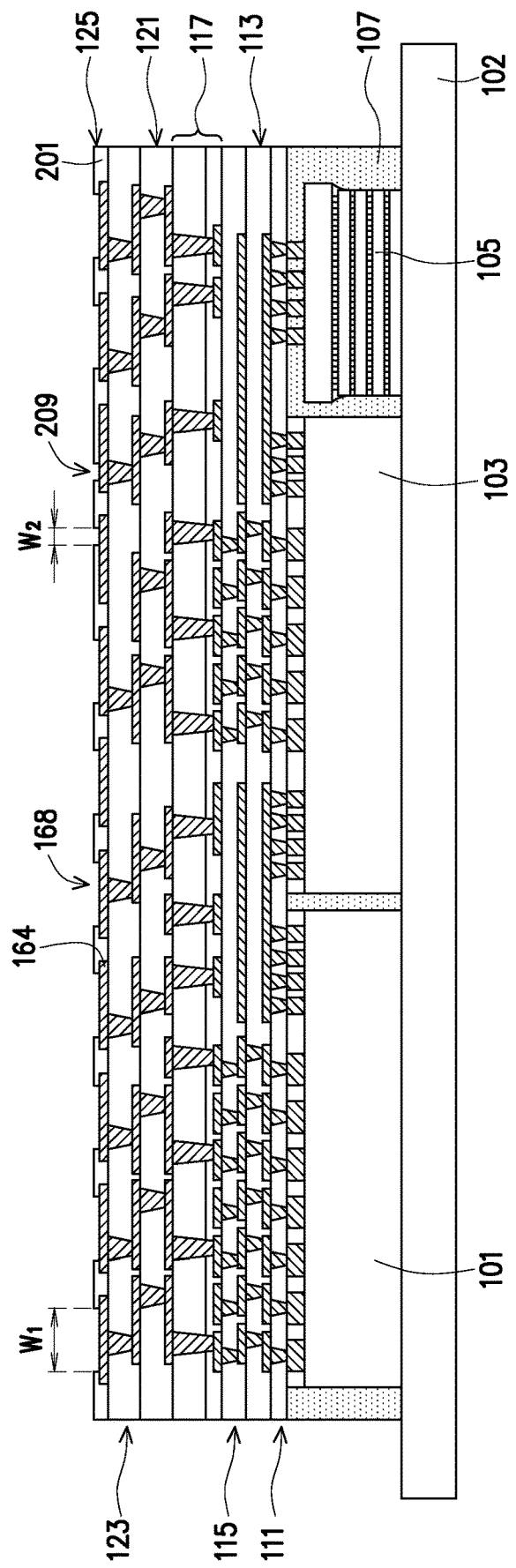

FIG. 2B illustrates that, once the polymer layer 201 has been formed, the polymer layer 201 may be patterned to form the first openings 168. In an embodiment in which the polymer layer 201 is a photosensitive polyimide material, the polymer layer 201 may be patterned by exposing the photosensitive polyimide material to a patterned energy source in order to induce a physical change within those portions that are exposed to the patterned energy source. Once exposed, the photosensitive polyimide material may be developed using a developer in order to separate the exposed portion of the polymer layer 201 from the unexposed portion of the polymer layer 201. However, any suitable method of patterning the polymer layer 201, such as a photolithographic masking and etching process, may be utilized.

FIG. 2B also illustrates that, while the patterning of the polymer layer 201 may form the first openings 168 to accommodate the placement of the first external connections 131 (as described above), the patterning of the polymer layer 201 may also form second openings 209 in order to accommodate the placement of second external connections 203 (not illustrated in FIG. 2B but illustrated and further described below with respect to FIG. 2F). As such, while the first openings 168 may be formed to have the first width $W_1$ of between about 10 µm and about 800 µm, such as about 500 µm, the second openings 209 may be formed to have a second width $W_2$ different from the first width of between about 5 µm and about 100 µm, such as about 20 µm. However, any suitable dimensions may be utilized.

Figure 2C:
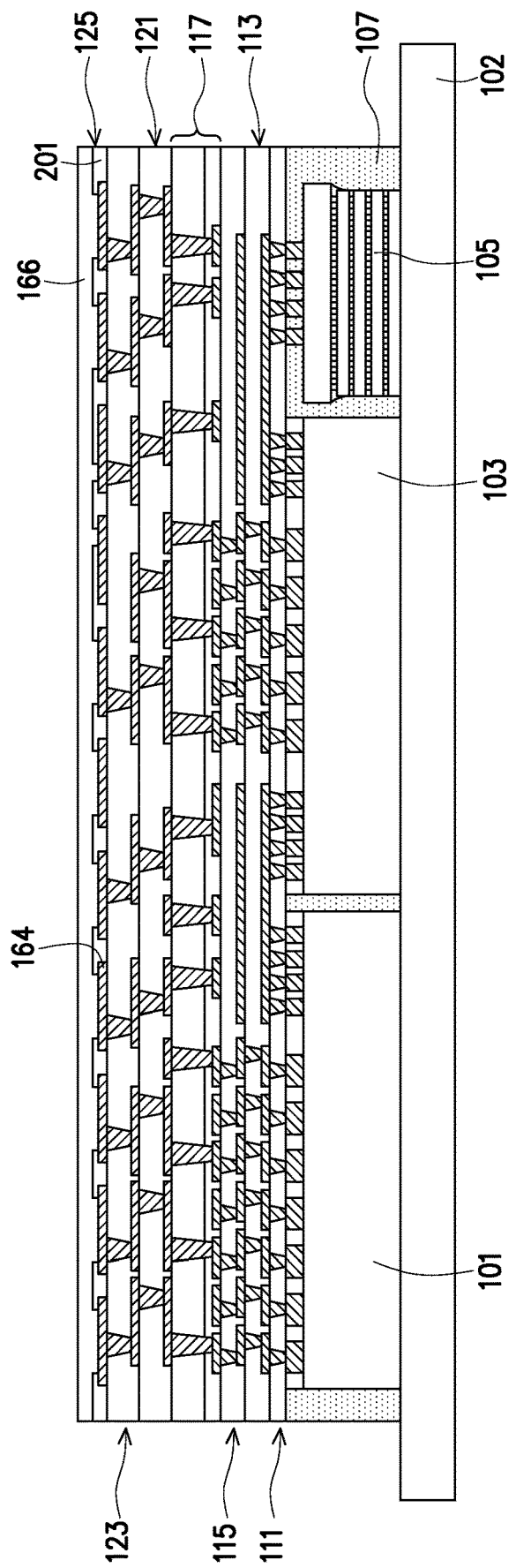

FIG. 2C illustrates that, once the polymer layer 201 has been patterned to form the first openings 168 and the second openings 209, the sixth redistribution passivation layer 166 may be deposited over the polymer layer 201. In an embodiment the sixth redistribution passivation layer 166 may be as described above with respect to FIG. 1N, such as by being a solder resist or PBO. However, any suitable material may be utilized.

Figure 2D:
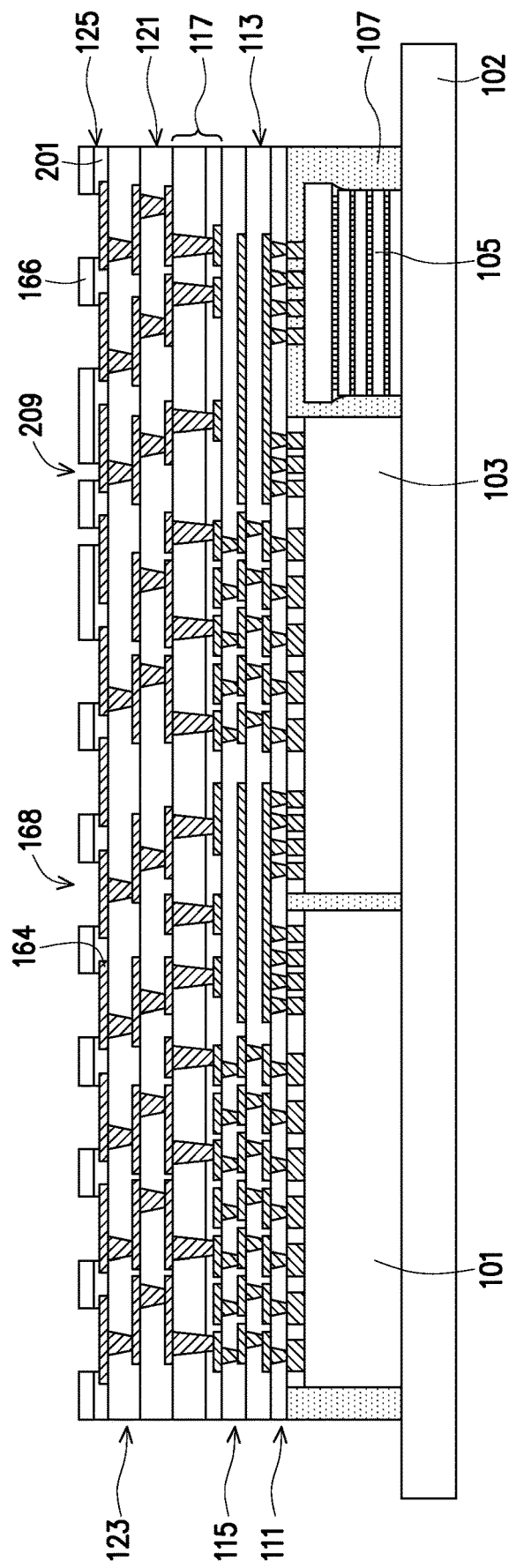

FIG. 2D illustrates that, once the sixth redistribution passivation layer 166 has been deposited, the sixth redistribution passivation layer 166 may be patterned in order to form the first openings 168 and the second openings 209 and expose the underlying portions of the fifth conductive line portion 164 of the sixth redistribution layer 125. In an embodiment the sixth redistribution passivation layer 166 may be patterned as described above with respect to FIG.

1O. For example, in an embodiment in which the sixth redistribution passivation layer 166 is photosensitive, the sixth redistribution passivation layer 166 may be exposed to a patterned energy source in order to induce a physical change within those portions that are exposed to the patterned energy source. Once exposed, the photosensitive material may be developed in order to separate the exposed portion of the sixth redistribution passivation layer 166 from the unexposed portion of the sixth redistribution passivation layer 166. However, any suitable method of patterning the sixth redistribution passivation layer 166, such as a photolithographic masking and etching process, may be utilized.

Figure 2E:
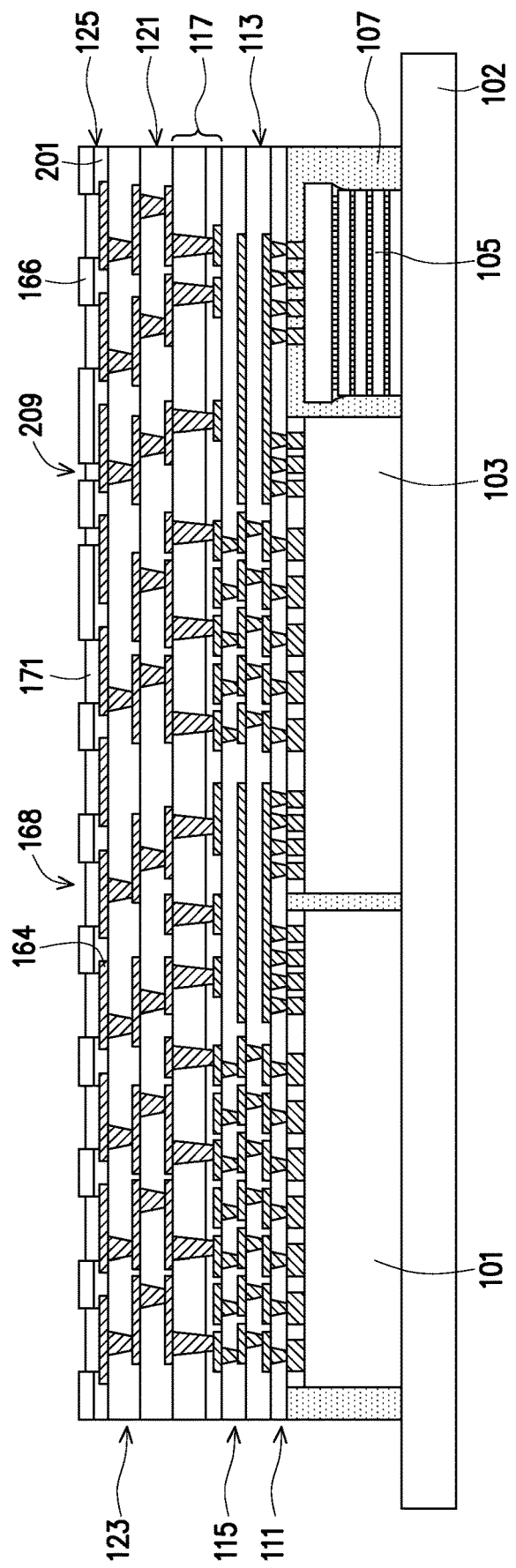

FIG. 2E illustrates the placement of the optional metal finish 171 within the first openings 168 and the second openings 209. In an embodiment the optional metal finish 171 may be placed as described above with respect to FIG. 1P. For example, the metal finish 171 may be an ENEPIG structure performed with a plating process. However, any suitable process may be utilized.

Figure 2F:
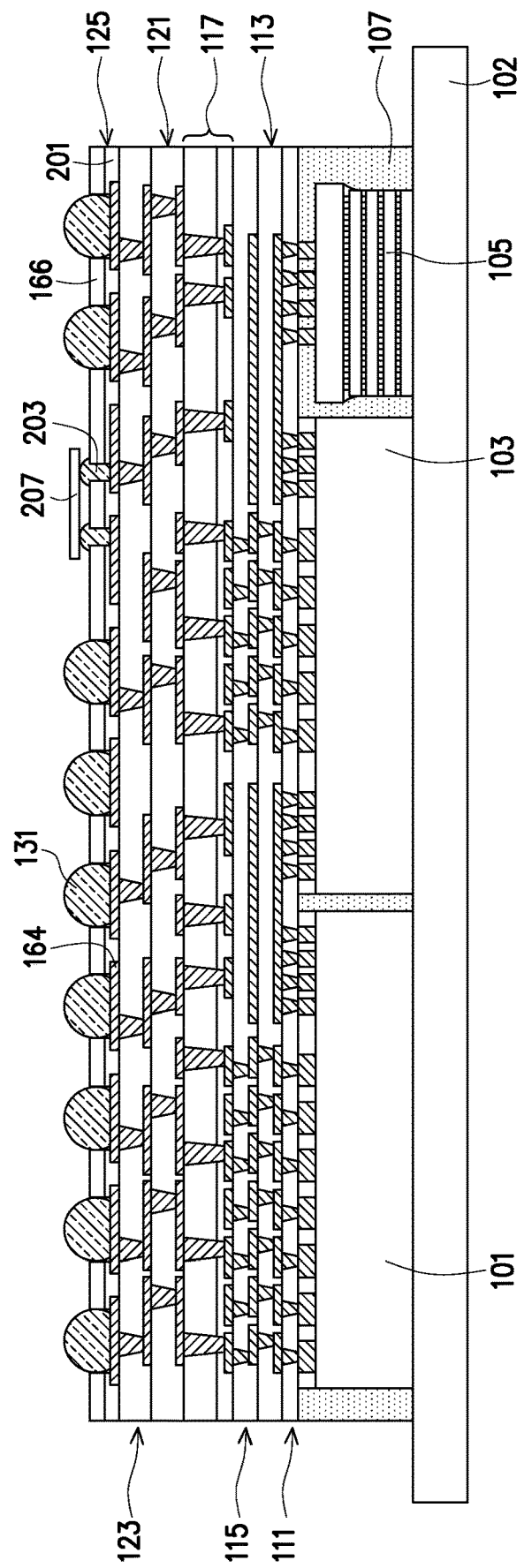

FIG. 2F illustrates that once the sixth redistribution passivation layer 166 has been deposited and patterned, the first external connections 131 are placed or formed into the first openings 168 and in electrical connection with the fifth conductive line portion 164 of the sixth redistribution layer 125. In an embodiment the first external connections 131 may be placed as described above with respect to FIG. 1Q. For example, the first external connections 131 may be placed using a ball drop method, although any suitable method may be utilized.

FIG. 2F additionally illustrates a placement of the second external connections 203 into the second openings 209. In an embodiment the second external connections 203 may be a different type of external connection than the first external connection 131. For example, in an embodiment in which the first external connections 131 are solder balls, the second external connections 203 may be microbumps, solder bumps, or copper studs. In an embodiment in which the second external connections 203 are microbumps, the second external connections 203 may have a diameter of between about 8 µm and about 100 µm and the second external connections 203 may be placed utilizing a ball drop method or plating method. However, any suitable type of external connection and method of manufacture may be utilized.

Optionally, if desired, a first surface device 207 may be mounted onto the second external connections 203. In an embodiment the first surface device 207 may be used to provide additional functionality or programming. In an embodiment the first surface device 207 may be a surface mount device (SMD) or an integrated passive device (IPD) that comprise passive devices such as resistors, inductors, capacitors, jumpers, combinations of these, or the like that are desired to be connected to and utilized in conjunction with the first semiconductor device 101, the second semiconductor device 103, and the memory stack 105

Figure 2G:
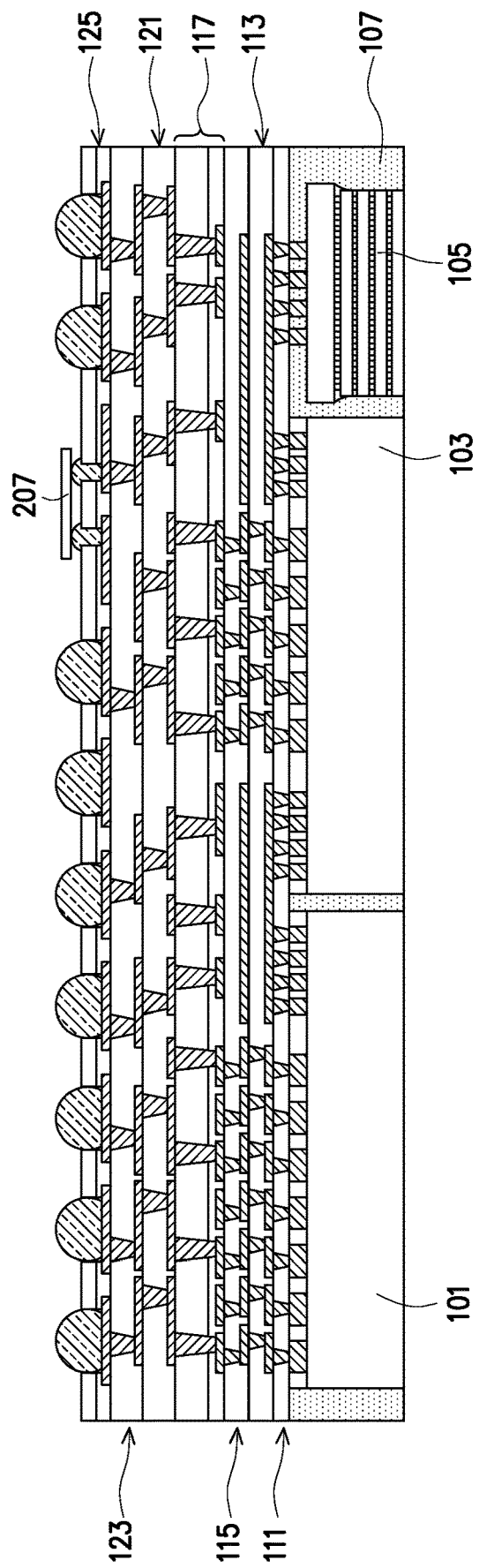

FIG. 2G illustrates a debonding of the carrier wafer 102 from the first semiconductor device 101, the second semiconductor device 103, and the memory stack 105. In an embodiment the carrier wafer 102 may be debonded as described above with respect to FIG. 1R. For example, an adhesive material may be modified to lose at least some of its adhesion, and then the adhesive material and carrier wafer 102 may be removed. However, any suitable method of debonding the carrier wafer 102 may be utilized.

Figure 2H:
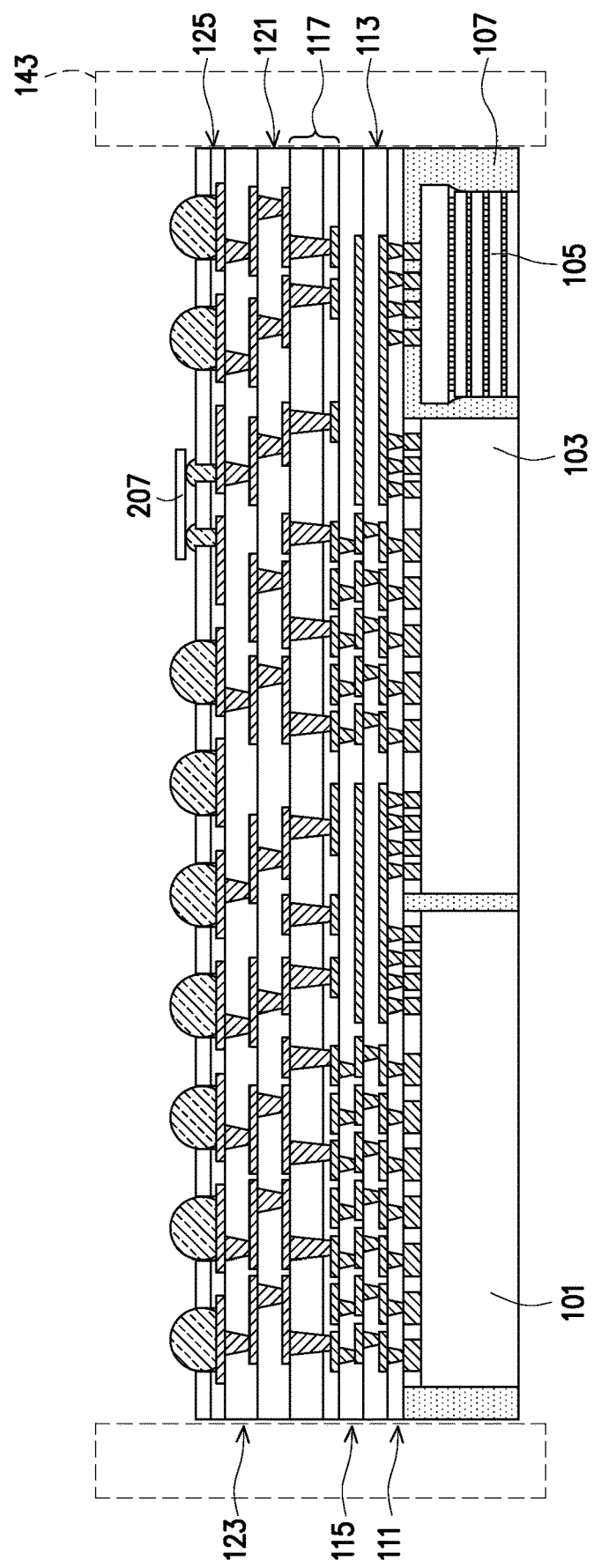

FIG. 2H illustrates a singulation of the structure. In an embodiment the singulation may be performed as described above with respect to FIG. 1S. For example, a saw blade may be utilized to saw through and separate different portions of the structure. However, any suitable method of singulating the structure may be utilized.

Figure 2I:
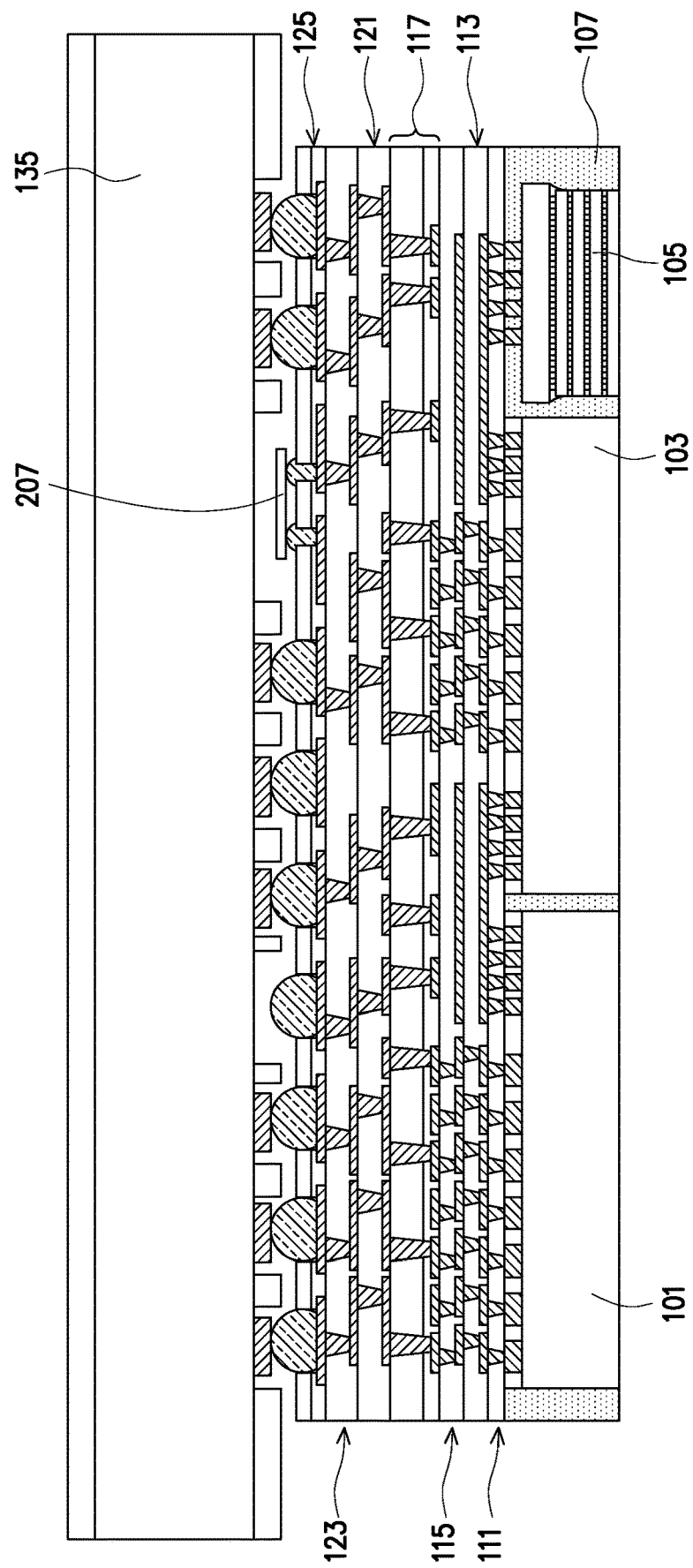

FIG. 2I illustrates a bonding of the first external connections 131 to the support substrate 135. In an embodiment the support substrate 135 may be as described above with respect to FIG. 1T. However, any suitable substrate may be utilized.

Figure 3:
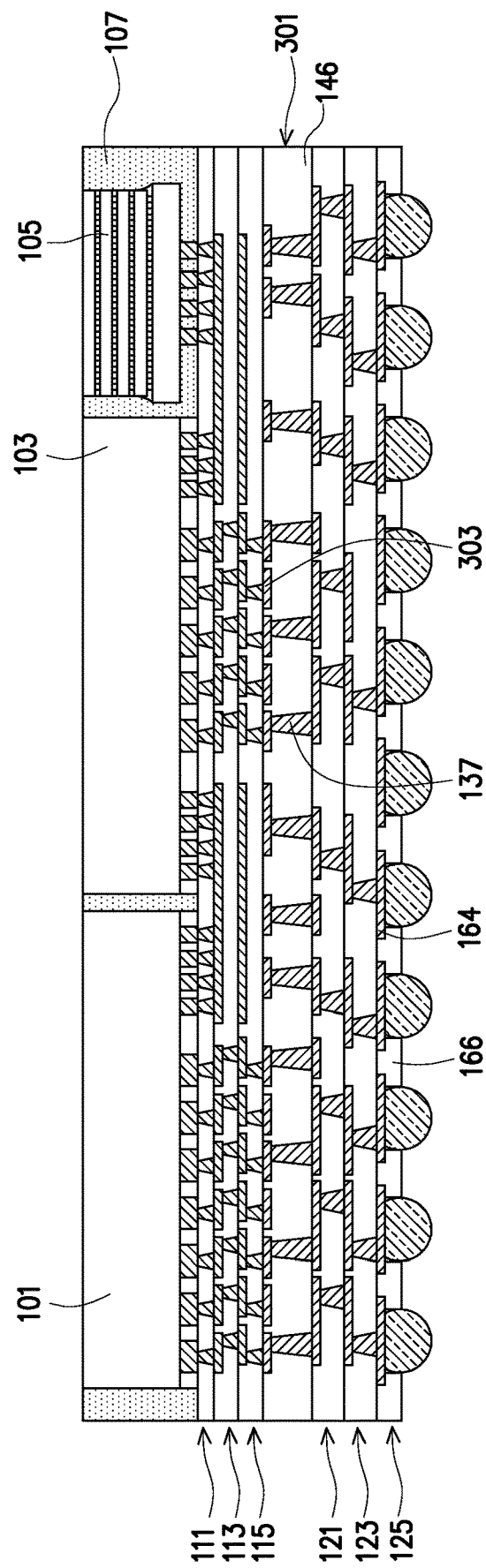
FIG. 3 illustrates a semiconductor device with a pure dielectric within a redistribution layer in accordance with some embodiments.

FIG. 3 illustrates another embodiment that may be utilized after the process described in FIGS. 1A-1G have been completed. In this embodiment, however, instead of depositing the first composite dielectric material 144 and the second composite dielectric material 146 in order to form a composite dielectric layer, the second composite dielectric material 146 is deposited without the first composite dielectric material 144. As such, instead of forming a composite redistribution layer 117 (as described above with respect to FIGS. 1A-1L), an intermediate redistribution layer 301 is formed instead.

In an embodiment, during the formation of the material for the third conductive via 140 of the third redistribution layer 115, an intermediate conductive line 303 of the intermediate redistribution layer 301 is formed. In an embodiment the third conductive via 140 of the third redistribution layer 115 and the intermediate conductive line 303 of the intermediate redistribution layer 301 may be formed similar to the formation of the third conductive via 140 of the third redistribution layer 115 and the third conductive line portion 142 of the composite redistribution layer 117, as described above with respect to FIG. 1G.

However, once the intermediate conductive line 303 of the intermediate redistribution layer 301 has been formed, in this embodiment the second composite dielectric material 146 is deposited directly onto the intermediate conductive line 303 of the intermediate redistribution layer 301. For example, the second composite dielectric material 146 may be an Ajinomoto build up film or a prepreg material with filler or fiber inside. In this embodiment the second composite dielectric material 146 may be formed to a thickness of between about 1 µm and about 30 µm, such as about 5 µm. However, any suitable thickness may be utilized.

FIG. 3 additionally illustrates that, once the second composite dielectric material 146 has been deposited in direct contact with the intermediate conductive line 303 of the intermediate redistribution layer 301, the vias 137 may be formed through the second composite dielectric material 146 in order to make contact with the third conductive line portion 142 of the composite redistribution layer 117. In an embodiment the vias 137 may be formed as described above with respect to FIGS. 1I-1L. For example, the second composite dielectric material 146 may be patterned using, e.g., a laser drill process, a seed layer is deposited, a photoresist is deposited and patterned, conductive material is plated into the openings, the photoresist is removed, and exposed portions of the seed layer are removed.

FIG. 3 additionally illustrates that, once the intermediate redistribution layer 301 has been formed, the fourth redistribution layer 121, the fifth redistribution layer 123, and the sixth redistribution layer 125 may be formed over the intermediate redistribution layer 301 as described above with respect to FIGS. 1L-1Q. In particular, the fourth redistribution layer 121 and the fifth redistribution layer 123 are formed, the sixth redistribution passivation layer 166 (e.g., solder mask or PBO) is disposed and patterned, and the first external connections 131 are placed through the sixth redistribution passivation layer 166 and in electrical connection with the fifth conductive line portion 164 of the sixth redistribution layer 125.

Figure 4:
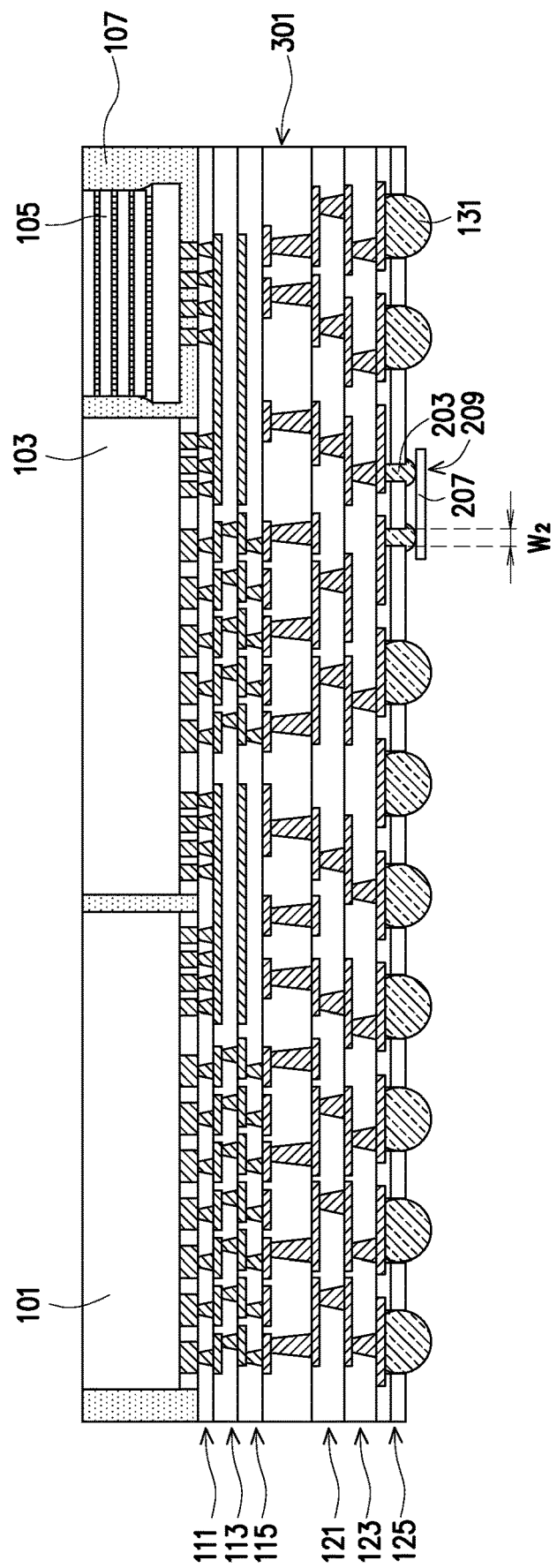
FIG. 4 illustrates a semiconductor device with a pure dielectric within a redistribution layer and a polyimide top dielectric layer in accordance with some embodiments.

FIG. 4 illustrates another embodiment which utilizes the intermediate redistribution layer 301 as described above with respect to FIG. 3. In this embodiment, however, instead of utilizing the sixth redistribution layer 125 as described above with respect to FIGS. 1A-1S (in which the sixth redistribution passivation layer 166 is formed directly on the fifth redistribution passivation layer 160), the sixth redistribution layer 125 includes the polymer layer 201 being formed directly on the fifth redistribution passivation layer 160. In an embodiment the polymer layer 201 may be deposited as described above with respect to FIG. 2A.

Additionally, in an embodiment the polymer layer 201 is deposited and patterned to form the first openings 168 and the second openings 209 before the sixth redistribution passivation layer 166 is deposited and patterned. Further, the first openings 168 and the second openings 209 are each patterned to have the first width $W_1$ and the second width $W_2$ in order to accommodate different types of external connections, such as the first external connections 131 and the second external connections 203, respectively.

FIG. 4 additionally illustrates that, once the polymer layer 201 is formed and patterned, the sixth redistribution passivation layer 166 may be deposited and patterned, the first external connections 131 and the second external connections 203 may be placed or formed, and the first surface device 207 may be connected to the second external connections 203. In an embodiment the sixth redistribution passivation layer 166 may be deposited and patterned, the first external connections 131 and the second external connections 203 may be placed or formed, and the first surface device 207 may be connected to the second external connections 203 as described above with respect to FIGS. 2C-2H. However, any suitable methods may be utilized.

Figure 5A:
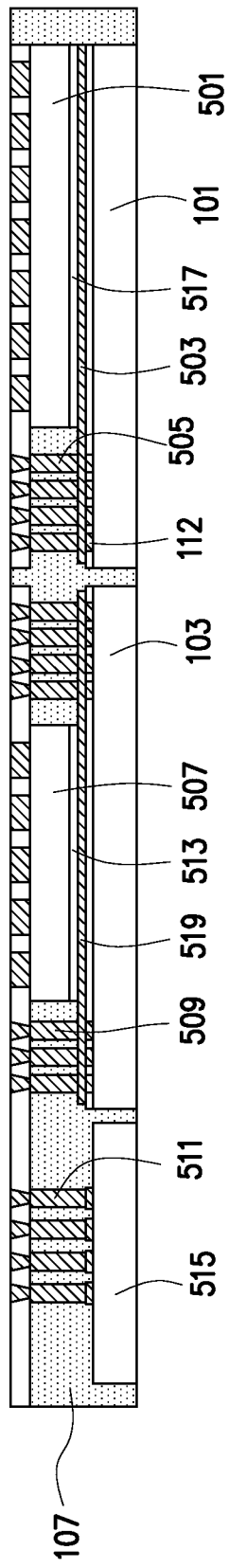
FIGS. 5A-5B illustrate embodiments of stacked dies in accordance with some embodiments.
Figure 5B:
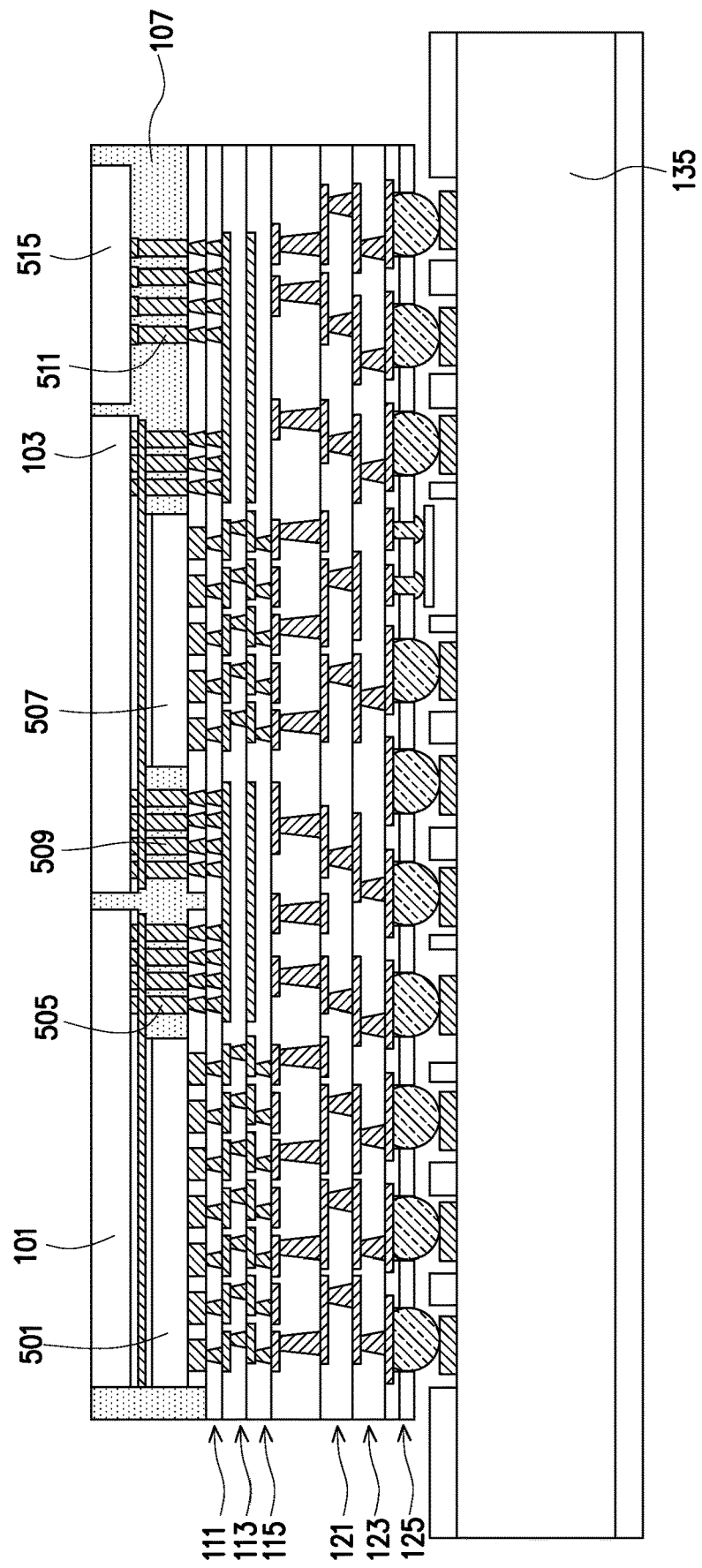

FIGS. 5A-5B illustrate another embodiment in which the first semiconductor device 101 and the second semiconductor device 103 are part of a stacked series of semiconductor devices. For example, in one embodiment the first semiconductor device 101 may be stacked with a third semiconductor device 501 in a stacked configuration. In some embodiments, the first semiconductor device 101 is also referred to as a first semiconductor die 101, the second semiconductor device 103 is also referred to as a second semiconductor die 103, and the third semiconductor device 501 is also referred to as a third semiconductor die 501. In an embodiment the third semiconductor device 501 is designed for a desired functionality, such as being a system-on-chip, a graphic die, a MEMS dies, a sensor die, a photonic die, a memory die, other logic dies, combinations of these, or the like and may comprise a third substrate, third active devices, third metallization layers, third contact pads, a third passivation layer, and fourth external connectors (none of which are illustrated for simplicity in FIG. 5A). In an embodiment the third substrate, the third active devices, the third metallization layers, the third contact pads, the third passivation layer, and the fourth external connectors may be similar to the first substrate, the first active devices, the first metallization layers, the first contact pads, the first passivation layer 110, and the first external connectors 112, although they may also be different.

Additionally in this embodiment, the first semiconductor device 101 may also comprise a seventh redistribution layer 503 formed in connection with the first external connectors 112. In an embodiment the seventh redistribution layer 503 may be formed as described in any of the description above with respect to FIGS. 1A-1S. For example, a passivation layer may be deposited, an opening may be formed within the passivation layer, and conductive material may be plated to form a via and a conductive line, which may then be covered by another dielectric layer. However, any suitable method or material may be utilized.

Once the seventh redistribution layer 503 has been formed, first through interposer vias (TIVs) 505 may be formed on the seventh redistribution layer 503. In an embodiment the first TIVs 505 may be formed by initially placing a seed layer (not separately illustrated in FIG. 5A) over the seventh redistribution layer 503. In an embodiment the seed layer is a thin layer of a conductive material that aids in the formation of a thicker layer during subsequent processing steps. The seed layer may comprise a layer of titanium followed by a layer of copper, although any other suitable material or combination of materials, such as a single layer of copper, may also be used. The seed layer may be created using processes such as sputtering, evaporation, or PECVD processes, depending upon the desired materials.

Once the seed layer is formed, a placement and patterning of a photoresist over the seed layer is performed. In an embodiment the photoresist may be disposed on the seed layer using, e.g., a spin coating technique to a height of between about 50 μm and about 250 μm. Once in place, the photoresist may then be patterned by exposing the photoresist to a patterned energy source (e.g., a patterned light source) so as to induce a chemical reaction, thereby inducing a physical change in those portions of the photoresist exposed to the patterned light source. A developer is then applied to the exposed photoresist to take advantage of the physical changes and selectively remove either the exposed portion of the photoresist or the unexposed portion of the photoresist, depending upon the desired pattern.

In an embodiment the pattern formed into the photoresist is a pattern for the first TIVs 505. The first TIVs 505 are formed in such a placement as to be located around where the third semiconductor device 501 is desired to be located in the final product. However, any suitable arrangement for the pattern of first TIVs 505, such as by being located on a single side of the location for the third semiconductor device 501, may also be utilized.

In an embodiment the first TIVs 505 are formed within the photoresist, and comprise one or more conductive materials, such as copper, tungsten, other conductive metals, or the like, and may be formed, for example, by electroplating, electroless plating, or the like. In an embodiment, an electroplating process is used wherein the seed layer and the photoresist are submerged or immersed in an electroplating solution. The seed layer surface is electrically connected to the negative side of an external DC power supply such that the seed layer functions as the cathode in the electroplating process. A solid conductive anode, such as a copper anode, is also immersed in the solution and is attached to the positive side of the power supply. The atoms from the anode are dissolved into the solution, from which the cathode, e.g., the seed layer, acquires the dissolved atoms, thereby plating the exposed conductive areas of the seed layer within the opening of the photoresist.

Once the first TIVs 505 have been formed using the photoresist and the seed layer, the photoresist may be removed using a suitable removal process. In an embodiment, a plasma ashing process may be used to remove the photoresist, whereby the temperature of the photoresist may be increased until the photoresist experiences a thermal decomposition and may be removed. However, any other suitable process, such as a wet strip, may alternatively be utilized. The removal of the photoresist may expose the underlying portions of the seed layer.

Once exposed a removal of the exposed portions of the seed layer may be performed. In an embodiment the exposed portions of the seed layer (e.g., those portions that are not covered by the first TIVs 505) may be removed by, for example, a wet or dry etching process. For example, in a dry etching process reactants may be directed towards the seed layer using the first TIVs 505 as masks. In another embodiment, etchants may be sprayed or otherwise put into contact with the seed layer in order to remove the exposed portions of the seed layer. After the exposed portion of the seed layer has been etched away, a portion of the seventh redistribution layer 503 is exposed between the first TIVs 505.

Once the first TIVs 505 have been formed, the third semiconductor device 501 may be attached to the first semiconductor device 101 using, e.g., a pick and place process. In an embodiment the third semiconductor device 501 may be attached using a first die attach film (DAF) 517. In an embodiment the first die attach film 517 is an epoxy resin, a phenol resin, acrylic rubber, silica filler, or a combination thereof, and is applied using a lamination technique. However, any other suitable alternative material and method of formation may alternatively be utilized.

FIG. 5A additionally illustrates a formation of an eighth redistribution layer 519 on the second semiconductor device 103 as well as a formation of second TIVs 509 over and in connection with the eighth redistribution layer 519. In an embodiment the eighth redistribution layer 519 and the second TIVs 509 may be formed as described above with respect to the seventh redistribution layer 503 and the first TIVs 505. However, any suitable methods may be utilized.

Additionally, once the second TIVs 509 have been formed, a fourth semiconductor device 507 may be attached to the eighth redistribution layer 519. In some embodiments, the fourth semiconductor device 507 is also referred to as a fourth semiconductor die 507. In an embodiment the fourth semiconductor device 507 is designed for a desired functionality, such as being a system-on-chip, a graphic die, a MEMS dies, a sensor die, a photonic die, a memory die, other logic dies, combinations of these, or the like and may comprise a fourth substrate, fourth active devices, fourth metallization layers, fourth contact pads, a fourth passivation layer, and fifth external connectors (none of which are illustrated for simplicity in FIG. 5A). In an embodiment the fourth substrate, the fourth active devices, the fifth metallization layers, the fourth contact pads, the fourth passivation layer, and the fourth external connectors may be similar to the first substrate, the first active devices, the first metallization layers, the first contact pads, the first passivation layer 110, and the first external connectors 112, although they may also be different.

In an embodiment the fourth semiconductor device 507 may be attached using a second die attach film (DAF) 513 using, e.g., a pick and place process. In an embodiment the second die attach film 513 may be similar to the first die attached film 517, such as by being an epoxy resin, a phenol resin, acrylic rubber, silica filler, or a combination thereof, and is applied using a lamination technique. However, any other suitable alternative material and method of formation may alternatively be utilized.

FIG. 5A additionally illustrates that third TIVs 511 may be formed on a fifth semiconductor device 515. In an embodiment the fifth semiconductor device 515 is designed for a desired functionality, such as being a system-on-chip, a graphic die, a MEMS dies, a sensor die, a photonic die, a memory die, other logic dies, combinations of these, or the like and may comprise a fifth substrate, fifth active devices, fifth metallization layers, fifth contact pads, a fifth passivation layer, and sixth external connectors (none of which are illustrated for simplicity in FIG. 5A). In an embodiment the fifth substrate, the fifth active devices, the fifth metallization layers, the fifth contact pads, the fifth passivation layer, and the sixth external connectors may be similar to the first substrate, the first active devices, the first metallization layers, the first contact pads, the first passivation layer 110, and the first external connectors 112, although they may also be different.

The third TIVs 511 may be formed on the fifth semiconductor device 515. In an embodiment the third TIVs 511 may be formed as described above with respect to the first TIVs 505. However, in an embodiment the third TIVs 511 are formed directly on the fifth semiconductor device 515 without an intervening redistribution layer, although a redistribution layer may be formed if desired.

FIG. 5A additionally illustrates an encapsulation of the first semiconductor device 101, the second semiconductor device 103, the third semiconductor device 501, the fourth semiconductor device 507, and the fifth semiconductor device 515. In an embodiment the first semiconductor device 101, the second semiconductor device 103, the third semiconductor device 501, the fourth semiconductor device 507, and the fifth semiconductor device 515 (along with their corresponding TIVs) may be encapsulated as described above with respect to FIG. 1B. For example, the first semiconductor device 101, the second semiconductor device 103, the third semiconductor device 501, the fourth semiconductor device 507, and the fifth semiconductor device 515 may be placed into a molding chamber and the encapsulant 107 may be injected or otherwise placed to encapsulate the first semiconductor device 101, the second semiconductor device 103, the third semiconductor device 501, the fourth semiconductor device 507, and the fifth semiconductor device 515.

Additionally, once the encapsulant 107 has been placed, the encapsulant 107 may be planarized in order to expose the third semiconductor device 501, the first TIVs 505, the fourth semiconductor device 507, the second TIVs 509, and the third TIVs 511. In an embodiment the planarization may be performed using a chemical mechanical polishing process, although any suitable planarization process may be utilized.

FIG. 5B illustrates that, once the third semiconductor device 501, the first TIVs 505, the fourth semiconductor device 507, the second TIVs 509, and the third TIVs 511 have been exposed, the first redistribution layer 111 may be formed in physical and electrical connection with the third semiconductor device 501, the first TIVs 505, the fourth semiconductor device 507, the second TIVs 509, and the third TIVs 511. Further, the second redistribution layer 113, the third redistribution layer 115, the intermediate redistribution layer 301, the fourth redistribution layer 121, the fifth redistribution layer 123, and the sixth redistribution layer 125 with the first external connections 131 and the second external connections 203 may be formed, and the structure can be attached to the support substrate (for example, a printed circuit board) 135.

Figure 6:
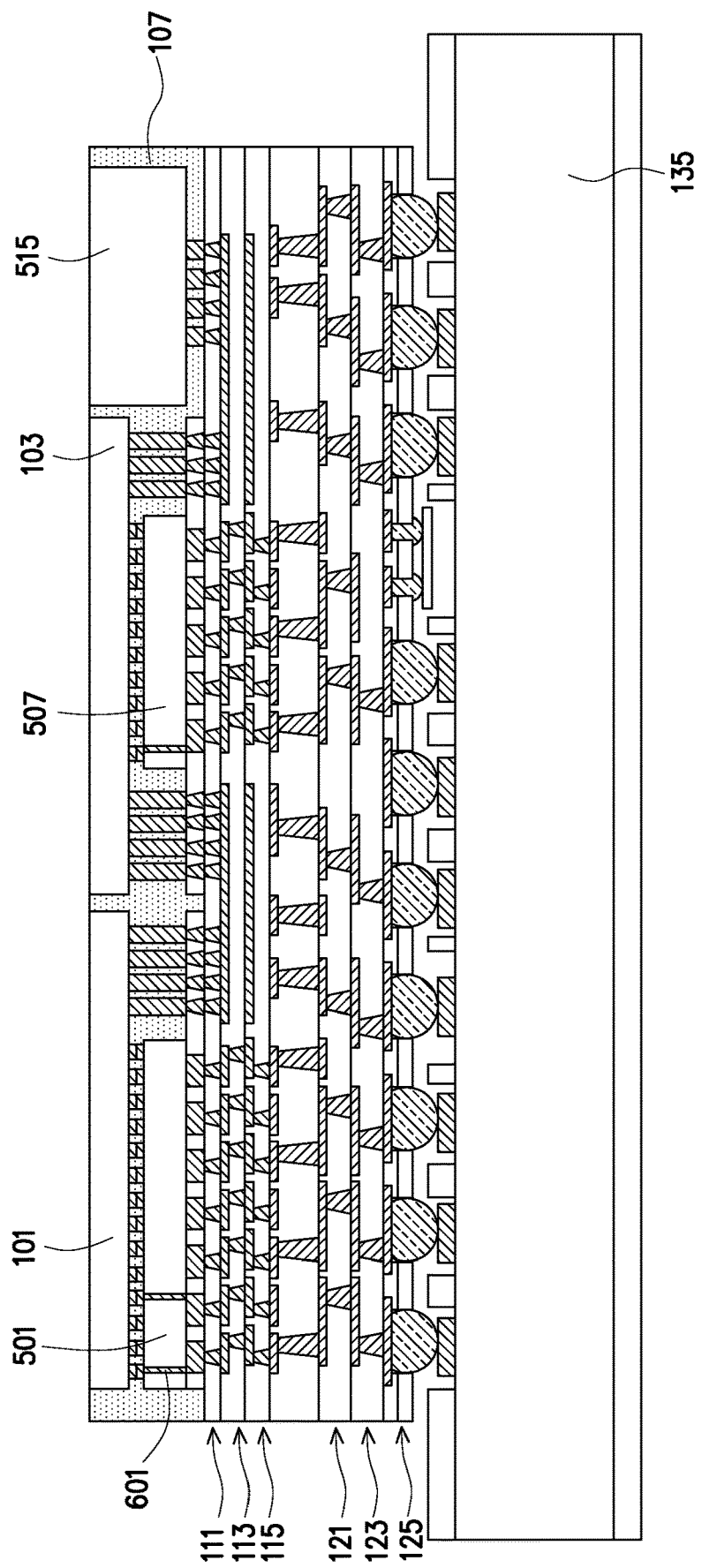
FIG. 6 illustrates an embodiment with stacked dies in a face-to-face configuration in accordance with some embodiments.

FIG. 6 illustrates another embodiment in which the first semiconductor device 101 is in a stack configuration with the third semiconductor device 501. In this embodiment, however, instead of the third semiconductor device 501 being connected to the first semiconductor device 101 using a die attach film, the third semiconductor device 501 is bonded to the first semiconductor device 101 in a face-toface configuration without the presence of the seventh redistribution layer 503. In a specific embodiment the third semiconductor device is bonded to the first semiconductor device 101 through a direct, copper-to-copper bond between external connections. However, any suitable bonding process, such as a dielectric bonding process or hybrid bonding process, may also be utilized to bond and interconnect the first semiconductor device 101 to the third semiconductor device 501.

Additionally in this embodiment, because the third semiconductor device 501 is bonded in a face-to-face configuration with the first semiconductor device 101, the third semiconductor device 501 may additionally comprise one or more through substrate vias 601 in order to provide interconnectivity between the third semiconductor device 501 and the first redistribution layer 111. In an embodiment the through substrate vias 601 may be formed by initially forming deep vias in the third semiconductor substrate and filling the deep vias with a conductive material. The third semiconductor substrate may then be thinned from the backside to expose the conductive material and form the through substrate vias.

Similarly, the fourth semiconductor device 507 may be bonded to the second semiconductor device 103 in a face-face configuration. In such an embodiment the fourth semiconductor device 507 also has through substrate vias 601 formed within the fourth semiconductor device 507. The through substrate vias 601 within the fourth semiconductor device 507 may be formed in a similar fashion as the through substrate vias 601 within the third semiconductor device 501. However, any suitable processes may be utilized.

Additionally in this embodiment the fifth semiconductor device 515 may be formed without any corresponding through vias. As such, the fifth semiconductor device 515 may be formed to have a thickness that is equal to a combined thickness of the first semiconductor device 101 and the third semiconductor device 501. However, any suitable thickness may be utilized.

FIG. 6 additionally illustrates that, once the third semiconductor device 501 and the fourth semiconductor device 507 have been attached, the encapsulant 107 may be placed around the first semiconductor device 101, the second semiconductor device 103, the third semiconductor device 501, the fourth semiconductor device 507, and the fifth semiconductor device 515. Additionally, once the encapsulant 107 has been thinned, the first redistribution layer 111 may be formed in physical and electrical connection with the third semiconductor device 501, the first TIVs 505, the fourth semiconductor device 507, and the second TIVs 509. Further, the second redistribution layer 113, the third redistribution layer 115, the intermediate redistribution layer 301, the fourth redistribution layer 121, the fifth redistribution layer 123, and the sixth redistribution layer 125, the first external connections 131 and the second external connections 203 may be formed, and the structure can be attached to the support substrate (for example, a printed circuit board) 135.

Figure 7:
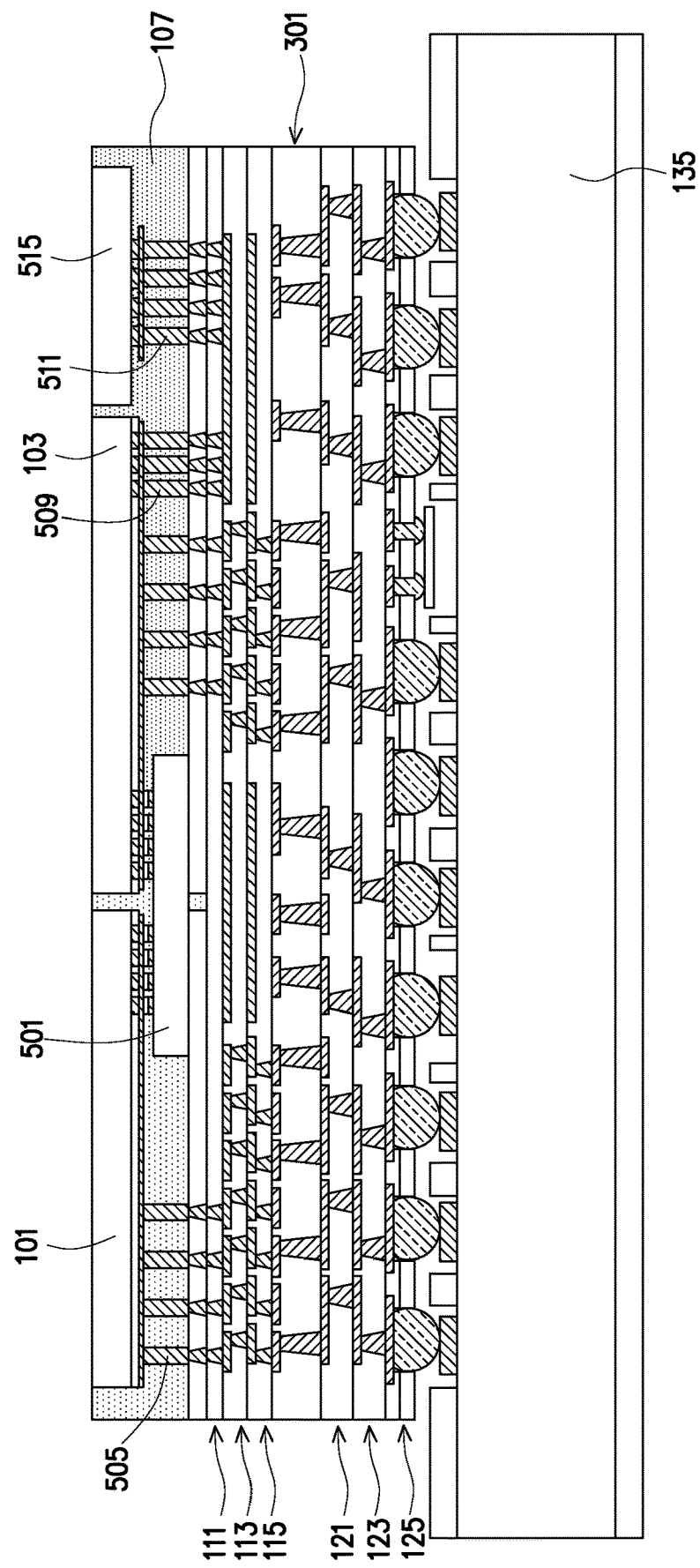
FIG. 7 illustrates an embodiment with stacked dies interconnected together in accordance with some embodiments.

FIG. 7 illustrates yet another embodiment in which the third semiconductor device 501 is bonded in face-to-face stacked configuration with the first semiconductor device 101, either with or without the presence of the eighth redistribution layer 519 and the seventh redistribution layer 503. In this embodiment, however, instead of being bonded to only the first semiconductor device 101, the third semiconductor device 501 is bonded to both the first semiconductor device 101 and the second semiconductor device 103. As such, the third semiconductor device 501 interconnects the first semiconductor device 101 and the second semiconductor device 103. In an embodiment the third semiconductor device 501 may be bonded in a face-to-face, direct copper-to-copper bonding process, although any suitable bonding process may be utilized.

FIG. 7 additionally illustrates that, once the third semiconductor device 501 has been attached to both the first semiconductor device 101 and the second semiconductor device 103, the encapsulant 107 may be placed around the first semiconductor device 101, the second semiconductor device 103, the third semiconductor device 501, and the fifth semiconductor device 515. Additionally, once the encapsulant 107 has been thinned, the first redistribution layer 111 may be formed in physical and electrical connection with the third semiconductor device 501, the first TIVs 505, the second TIVs 509, and the third TIVs 511. Further, the second redistribution layer 113, the third redistribution layer 115, the intermediate redistribution layer 301, the fourth redistribution layer 121, the fifth redistribution layer 123, and the sixth redistribution layer 125 with the first external connections 131 and the second external connections 203 may be formed, and the structure can be attached to the support substrate (for example, a printed circuit board) 135.

By utilizing the embodiments described herein, a wide range of structures may be developed and manufactured which overcome some of the limitations involved with larger package applications. For example, the embodiments herein can meet super large package size (e.g., greater than 70 mm*70 mm) desires in high performance computing applications. This can be done while still retaining excellent electrical performance and reducing reliability risks in both component and board level tests in even larger package sizes, such as larger than 100 mmSQ.

In accordance with an embodiment, method of manufacturing a semiconductor device includes encapsulating a first semiconductor die and a second semiconductor die with an encapsulant; forming a first redistribution layer over the encapsulant, the first redistribution layer comprising a first dielectric material; forming a second redistribution layer over the encapsulant different from the first redistribution layer, the second redistribution layer comprising both the first dielectric material and a second dielectric material different from the first dielectric material, the second dielectric material comprising either an Ajinomoto build up film or a prepreg material; and forming a first via through both the first dielectric material of the second redistribution layer and the second dielectric material of the second redistribution layer. In an embodiment, the forming the first redistribution layer forms the first dielectric material as a polyimide material. In an embodiment, the forming the first redistribution layer forms the second dielectric material as the Ajinomoto build up film. In an embodiment, the forming the first redistribution layer forms the second dielectric material as the prepreg material. In an embodiment, the method further includes electrically connecting a ball grid array to the first via. In an embodiment, the electrically connecting the ball grid array comprises extending the ball grid array through a first layer of Ajinomoto build up film in physical contact with a second layer of Ajinomoto build film. In an embodiment, the electrically connecting the ball grid array comprises extending the ball grid array through a first layer of Ajinomoto build up film and a layer of polyimide.

In accordance with another embodiment, a method of manufacturing a semiconductor device includes encapsulating a first semiconductor die and a second semiconductor die with an encapsulant; forming a first redistribution layer over the encapsulant, the forming the first redistribution layer comprising: forming a first dielectric material over the encapsulant; forming a glue layer over the first dielectric material; and forming a first conductive line over the glue layer; forming a second redistribution layer over the first redistribution layer, the forming the second redistribution layer comprising: forming a second dielectric material different from the first dielectric material, the second dielectric material extending from a first side of the second redistribution layer to a second side of the second redistribution layer opposite the first side of the second redistribution layer, wherein the second dielectric material is either an Ajinomoto build up film or a prepreg material; and forming a conductive via through the second dielectric material without a glue layer between the conductive via and the second dielectric material. In an embodiment the forming the second dielectric material forms a prepreg material. In an embodiment the forming the second dielectric material forms an Ajinomoto build up film. In an embodiment the method further includes applying a layer of polyimide over the second redistribution layer; applying a layer of Ajinomoto build up film in physical contact with the layer of polyimide; and placing a first external connection through both the layer of polyimide and the layer of Ajinomoto build up film. In an embodiment the method further includes placing a second external connection through both the layer of polyimide and the layer of Ajinomoto build up film, the second external connection being a different type of external connection than the first external connection. In an embodiment the first external connection is a ball grid array and the second external connection is a microbump. In an embodiment the method further includes interconnecting the first semiconductor die with the second semiconductor die after the encapsulating the first semiconductor die and the second semiconductor die.

In accordance with yet another embodiment, a semiconductor device includes a first semiconductor die separated from a second semiconductor die; an encapsulant encapsulating the first semiconductor die and the second semiconductor die; a first redistribution layer over the encapsulant, the first redistribution layer including: a first dielectric layer; a first conductive via extending through the first dielectric layer; and a glue layer located between the first dielectric layer and the first conductive via; and a second redistribution layer over the first redistribution layer, the second redistribution layer including: a second dielectric layer; and a second conductive via extending through the second dielectric layer, the second conductive via being free of a glue layer. In accordance with an embodiment the second dielectric layer comprises an Ajinomoto build up film. In accordance with an embodiment the second dielectric layer comprises a prepreg material. In accordance with an embodiment the second redistribution layer further comprises a layer of polyimide, the second conductive via extending through the layer of polyimide. In accordance with an embodiment the semiconductor device further includes a layer of polyimide over the second dielectric layer; and a layer of Ajinomoto build up film in physical contact with the layer of polyimide. In accordance with an embodiment the semiconductor device further includes a ball grid array extending through the layer of polyimide; and a microbump extending through the layer of polyimide.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device comprising:
   a first semiconductor die and a second semiconductor die encapsulated within an encapsulant;
   a first redistribution layer over the encapsulant, the first redistribution layer comprising a first dielectric material and a first glue layer;
   a second redistribution layer over the encapsulant different from the first redistribution layer, the second redistribution layer comprising both the first dielectric material and a second dielectric material different from the first dielectric material, wherein the second redistribution layer is free from a glue layer; and
   a first via extending through both the first dielectric material of the second redistribution layer and the second dielectric material of the second redistribution layer.

2. The semiconductor device of claim 1, wherein the first dielectric material is a polyimide material.

3. The semiconductor device of claim 1, wherein the second dielectric material is an Ajinomoto build up film.

4. The semiconductor device of claim 1, wherein the second dielectric material is a prepreg material.

5. The semiconductor device of claim 1, further comprising a ball grid array electrically connected to the first via.

6. The semiconductor device of claim 5, wherein the ball grid array extends through a first layer of Ajinomoto build up film in physical contact with a second layer of Ajinomoto build film.

7. The semiconductor device of claim 5, wherein the ball grid array extends through a first layer of Ajinomoto build up film and a layer of polyimide.

8. A semiconductor device comprising:
   a first semiconductor die and a second semiconductor die encapsulated within an encapsulant;
   a first redistribution layer over the encapsulant, the first redistribution layer comprising:
     a first dielectric material over the encapsulant;
     a glue layer over the first dielectric material; and
     a first conductive line over the glue layer;
   a second redistribution layer over the first redistribution layer, the second redistribution layer comprising:
     a second dielectric material different from the first dielectric material, the second dielectric material extending from a first side of the second redistribution layer to a second side of the second redistribution layer opposite the first side of the second redistribution layer;
     a third dielectric material the same as the first dielectric material, wherein the second redistribution layer is free from glue material; and
     a conductive via through both the first dielectric material and the second dielectric material without a glue layer between the conductive via and the second dielectric material.

9. The semiconductor device of claim 8, wherein the second dielectric material is a prepreg material.

10. The semiconductor device of claim 8, wherein the second dielectric material is an Ajinomoto build up film.

11. The semiconductor device of claim 8, further comprising:
a layer of polyimide over the second redistribution layer;
a layer of Ajinomoto build up film in physical contact with the layer of polyimide; and
a first external connection through both the layer of polyimide and the layer of Ajinomoto build up film.

12. The semiconductor device of claim 11, further comprising a second external connection through both the layer of polyimide and the layer of Ajinomoto build up film, the second external connection being a different type of external connection than the first external connection.

13. The semiconductor device of claim 12, wherein the first external connection has a width greater than a width of the second external connection.

14. The semiconductor device of claim 8, wherein the first semiconductor die is interconnected with the second semiconductor die.

15. A semiconductor device comprising:
a first semiconductor die separated from a second semiconductor die;
an encapsulant encapsulating the first semiconductor die and the second semiconductor die;
a first redistribution layer over the encapsulant, the first redistribution layer comprising:
a first dielectric layer;
a first conductive via extending through the first dielectric layer; and
a glue layer located between the first dielectric layer and the first conductive via; and
a second redistribution layer over the first redistribution layer, the second redistribution layer comprising:
a second dielectric layer; and
a second conductive via extending through the second dielectric layer, the second conductive via being free of a glue layer.

16. The semiconductor device of claim 15, wherein the second dielectric layer comprises an Ajinomoto build up film.

17. The semiconductor device of claim 15, wherein the second dielectric layer comprises a prepreg material.

18. The semiconductor device of claim 15, wherein the second redistribution layer further comprises a layer of polyimide, the second conductive via extending through the layer of polyimide.

19. The semiconductor device of claim 15, further comprising:
a layer of polyimide over the second dielectric layer; and
a layer of Ajinomoto build up film in physical contact with the layer of polyimide.

20. The semiconductor device of claim 19, further comprising:
a first external connection with a first width extending through the layer of polyimide; and
a second external connection with a second width extending through the layer of polyimide, wherein the first width is greater than the second width.

* * * * *